United States Patent
Yamanaka et al.

(10) Patent No.: US 7,022,619 B2
(45) Date of Patent: Apr. 4, 2006

(54) METHOD FOR FABRICATING ELECTRONIC DEVICE

(75) Inventors: Michinari Yamanaka, Osaka (JP); Hiroshi Yuasa, Kyoto (JP); Tetsuo Satake, Hyogo (JP); Etsuyoshi Kobori, Kyoto (JP); Takeshi Yamashita, Osaka (JP); Susumu Matsumoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 160 days.

(21) Appl. No.: 10/395,182

(22) Filed: Mar. 25, 2003

(65) Prior Publication Data

US 2003/0186537 A1    Oct. 2, 2003

(30) Foreign Application Priority Data

Mar. 27, 2002  (JP) .............................. 2002-087883

(51) Int. Cl.
*H01L 21/302* (2006.01)
*H01L 21/461* (2006.01)
*H01L 21/4763* (2006.01)

(52) U.S. Cl. ...................... 438/725; 438/637; 438/706; 438/798

(58) Field of Classification Search ........ 438/637–640, 438/706, 717, 725, 798
See application file for complete search history.

(56) References Cited

U.S. PATENT DOCUMENTS

| 5,789,141 | A  | * | 8/1998  | Usujima .................... 430/313 |
| 5,843,847 | A  | * | 12/1998 | Pu et al. .................... 438/723 |
| 6,417,096 | B1 | * | 7/2002  | Chen et al. ................. 438/637 |
| 6,583,047 | B1 | * | 6/2003  | Daniels et al. .............. 438/623 |
| 6,620,745 | B1 | * | 9/2003  | Jang et al. .................. 438/787 |
| 6,649,531 | B1 | * | 11/2003 | Cote et al. .................. 438/714 |
| 6,764,810 | B1 | * | 7/2004  | Ma et al. .................... 430/313 |
| 6,798,043 | B1 | * | 9/2004  | Steiner et al. .............. 257/637 |
| 6,821,905 | B1 | * | 11/2004 | Pan et al. ................... 438/706 |

FOREIGN PATENT DOCUMENTS

JP    11-243147    9/1999

* cited by examiner

*Primary Examiner*—Ha Tran Nguyen
(74) *Attorney, Agent, or Firm*—McDermott Will & Emery LLP

(57) ABSTRACT

After a hole is formed in a low dielectric constant film on a substrate, a protective film is formed on the wall surface of the hole or an electron acceptor is caused to be adsorbed by or implanted in the low dielectric constant film exposed at the wall surface of the hole. Otherwise, resist residue is left on the wall surface of the hole. Then, a resist pattern having an opening corresponding to a wire formation region including a region formed with the hole is formed by using a chemically amplified resist.

12 Claims, 12 Drawing Sheets

METHOD FOR FABRICATING ELECTRONIC DEVICE

BACKGROUND OF THE INVENTION

The present invention relates to a method for forming a wire.

A method for forming a wire having a dual damascene structure, which is one of wire forming methods, is as follows: After a via hole and a wiring groove (hereinafter also referred to as a trench) are formed by patterning an insulating film, a wire is formed by burying a conductive film in the hole and groove. There are cases where a film composed of a material having a dielectric constant lower than that of the silicon oxide film (i.e., a low dielectric constant film), such as a silicon oxide film containing an organic material (i.e., a carbon-containing silicon oxide film), or a porous film is used as the insulating film between wires such that a wire-to-wire capacitance is reduced.

In a conventional wire forming method disclosed in Japanese Laid-Open Patent Publication No. HEI 11-243147, a dual damascene structure is formed by forming a via hole in a carbon-containing silicon oxide film and etching the carbon-containing silicon oxide film by using a resist film having a trench pattern as a mask.

In a conventional wire forming method using a low dielectric constant film such as a carbon-containing silicon oxide film, however, the problem is encountered that, if a trench pattern is to be formed by lithography using a chemically amplified resist, a resist film having a desired trench pattern cannot be formed. The problem will be described specifically with reference to the drawings.

FIGS. 10A and 10B show the problem encountered when a chemically amplified positive resist is used in the conventional wire forming method. As shown in FIG. 10A, an insulating film 52 in which a first wire 53 is buried is formed on a substrate 51. A protective film 54, an organic-material-containing silicon oxide film 55, and an antireflection film 56 are formed successively over the insulating film 52 including the first wire 53. After a via hole 57 was formed in the organic-material-containing silicon oxide film 55 and in the antireflection film 56, when a resist film 58 having a trench pattern was to be formed on the antireflection film 56 by lithography using a chemically amplified positive resist, the following problem occurred. When development was performed after the irradiation of the resist film 58 with light, the portion of the resist film 58 located in a trench formation region was not sufficiently dissolved so that a post-develop defect F, specifically the trailing of the resist (the remaining of the resist in a trailing fashion even in the hole), occurred. When the antireflection film 56 and the organic-material-containing silicon oxide film 55 were etched by using, as a mask, the resist film 58 including the trailing portion, a trench 59 having a fence 60 is formed, as shown in FIG. 10B. Due to the fence 60, the connection resistance between a wiring portion formed in the trench 59 and a plug portion formed in the via hole 57 is increased disadvantageously.

FIGS. 11A and 11B show a problem encountered when a chemically amplified negative resist is used in the conventional wire forming method. As shown in FIG. 11A, the insulating film 52 in which the first wire 53 is buried is formed on the substrate 51. The protective film 54, the organic-material-containing silicon oxide film 55, and the antireflection film 56 are formed successively over the insulating film 52 including the first wire 53. After the via hole 57 was formed in the organic-material-containing silicon oxide film 55 and in the antireflection film 56, when the resist film 58 having a trench pattern was to be formed on the antireflection film 56 by lithography using a chemically amplified negative resist, the following problem occurred. When development was performed after the irradiation of the resist film 58 with light, the resist film 58 was dissolved in a range wider than a trench formation region as desired. In other words, the resist film 58 having a trench pattern larger than a desired mask size was formed. When the antireflection film 56 and the organic-material-containing film 55 were etched subsequently by using the resist film 58 as a mask, the trench 59 having dimensions different from desired ones was formed disadvantageously, as shown in FIG. 11B.

FIG. 12A is a plan view showing a resist film having a trench pattern with desired mask dimensions which has been formed on an insulating film formed with a via hole.

By contrast, FIG. 12B is a plan view showing a resist film having a trench pattern with a trailing portion which has been formed by lithography using a chemically amplified positive resist on an insulating film formed with a via hole. As shown in FIG. 12B, there are cases where the connecting portion between the via and the trench is narrowed. In lithography using a positive resist, the resist irradiated with light is normally removed by development. In the case shown in FIG. 12B, however, the portion of the resist adjacent the via hole is not sufficiently removed so that the trench pattern with the trailing portion is formed disadvantageously.

On the other hand, FIG. 12C is a plan view showing a resist film having a trench pattern larger than desired mask dimensions which has been formed by lithography using a chemically amplified negative resist on an insulating film formed with a via hole. If the width of the trench pattern is increased, as shown in FIG. 12C, adjacent trenches may be combined with each other to cause a wiring short circuit. In lithography using a negative resist, the resist irradiated with light normally remains without being removed by development. In the case shown in FIG. 12C, however, the portion of the resist adjacent the via hole is removed upon development so that a trench pattern having an increased width is formed disadvantageously.

SUMMARY OF THE INVENTION

In view of the foregoing, it is therefore an object of the present invention to allow a resist film having a desired trench pattern to be formed by lithography using a chemically amplified resist on a low dielectric constant film formed with a via hole and thereby ensures the formation of a wire in a dual damascene structure.

To attain the object, the present inventors have examined the cause of a post-develop defect occurring in a resist in a conventional wire forming method using a low dielectric constant film, e.g., a carbon-containing silicon oxide film and made the following finding. That is, when a chemically amplified resist is coated on the carbon-containing silicon oxide film formed with a via hole, a resist poisoning phenomenon arises in which amine or a basic material contained in the carbon-containing silicon oxide film (especially the wall portion of the via hole) is diffused into the resist. As a result, a proton ($H^+$) generated from the chemically amplified resist upon exposure is neutralized by the foregoing basic material or the like. In other words, an acid indispensable to excellent development of the resist is deactivated. As a result, a post-develop defect occurs in the resist.

The present invention has been achieved based on the foregoing finding. Specifically, a first method for fabricating an electronic device according to the present invention comprises the steps of: forming a low dielectric constant film on a substrate; forming a hole in the low dielectric constant film; forming a protective film on at least a wall surface of the hole; after forming the protective film, coating a chemically amplified resist on the low dielectric constant film including the hole, and exposing and developing the coated chemically amplified resist to form a resist film having an opening corresponding to a wire formation region including a region formed with the hole; and etching the low dielectric constant film by using the resist film as a mask to form a wiring groove connected to the hole.

The first method for fabricating an electronic device forms a hole in a low dielectric constant film, e.g., a carbon-containing silicon oxide film, forms a protective film on the wall surface of the hole, and then forms the resist film having the opening corresponding to the wire formation region including the region formed with the hole, i.e., a resist film having a trench pattern by lithography using the chemically amplified resist. This prevents direct contact between the resist and the carbon-containing silicon oxide film in the hole during the coating of the chemically amplified resist and thereby prevents the diffusion of amine or a basic material from the carbon-containing silicon oxide film in the resist, i.e., the resist poisoning phenomenon. As a result, a post-develop defect in the resist can be prevented and a resist film having a desired trench pattern can be formed. This ensures the formation of a wire in a dual damascene structure.

In the first method for fabricating an electronic device, the protective film is preferably formed also on a portion of the low dielectric constant film located outside the hole.

The arrangement reliably prevents the resist poisoning phenomenon.

In the first method for fabricating an electronic device, an antireflection film is preferably formed on a portion of the low dielectric constant film located outside the hole.

The arrangement allows lithography using a chemically amplified resist to be performed precisely. In this case, the protective film is preferably formed also on the antireflection film. This reliably prevents the resist poisoning phenomenon.

Preferably, the first method for fabricating an electronic device further comprises, after the step for forming the wiring groove, the step of removing the protective film.

The arrangement prevents an increase in the resistance of a via plug.

In the first method for fabricating an electronic device, the low dielectric constant film is preferably a carbon-containing silicon oxide film or a porous film.

The arrangement ensures a reduction in the capacitance between wires. As the carbon-containing silicon oxide film, an SiOC film may also be used.

In the first method for fabricating an electronic device, the protective film is preferably a no-carbon-containing silicon oxide film.

The arrangement reliably prevents the resist poisoning phenomenon.

In the first method for fabricating an electronic device, the protective film is preferably a fluorocarbon film formed by using a plasma composed of a fluorocarbon gas.

The arrangement reliably prevents the resist poisoning phenomenon.

In the first method for fabricating an electronic device, the protective film is preferably a modified layer formed by increasing a density of a surface of the low dielectric constant film exposed at a wall surface of the hole.

The arrangement reliably prevents the resist poisoning phenomenon.

A second method for fabricating an electronic device according to the present invention comprises the steps of: forming a low dielectric constant film on a substrate; forming a hole in the low dielectric constant film; causing an electron acceptor to be adsorbed by or implanted in at least a portion the low dielectric constant film exposed at a wall surface of the hole; after the step of causing the electron acceptor to be adsorbed or implanted, coating a chemically amplified resist on the low dielectric constant film including the hole and exposing and developing the coated chemically amplified resist to form a resist film having an opening corresponding to a wire formation region including a region formed with the hole; and etching the low dielectric constant film by using the resist film as a mask to form a wiring groove connected to the hole.

The second method for fabricating an electronic device forms a hole in a low dielectric constant film, e.g., a carbon-containing silicon oxide film, causes an electron acceptor to be adsorbed by or implanted in the carbon-containing silicon oxide film in the wall portion of the hole, and then forms a resist film having an opening corresponding to a wire formation region including a region formed with the hole by lithography using the chemically amplified resist. This causes an acid-base reaction between the amine or basic material in the carbon-containing silicon oxide film and the adsorbed or implanted electron acceptor in the wall portion of the hole and thereby neutralizes the amine or the basic material in the carbon-containing silicon oxide film or reduces the concentration of the amine or the like. Even if the carbon-containing silicon oxide film and the chemically amplified resist are in direct contact with each other, therefore, the deactivation of an acid generated from the chemically amplified resist upon exposure can be prevented. As a result, a post-develop defect in the resist can be prevented and a resist film having a desired trench pattern can be formed so that a wire in a dual damascene structure is formed reliably.

In the second method for fabricating an electronic device, the step of causing the electron acceptor to be adsorbed or implanted preferably includes the step of causing an ion having a positive charge to be adsorbed by or implanted in the low dielectric constant film by using a plasma.

The arrangement reliably neutralizes the amine or the basic material in the low dielectric constant film, e.g., a carbon-containing silicon oxide film or positively reduces the concentration of the amine therein.

In this case, a gas composing the plasma preferably contains at least one of a $H_2$ gas and a $H_2O$ gas. In the arrangement, ions implanted into the carbon-containing silicon oxide film become $H^+$ ions or $OH^+$ ions which are small in mass so that the size enlargement of an upper portion of the via hole is prevented. In addition, damage caused by a plasma to the substrate (plasma damage) can be minimized.

A third method for fabricating an electronic device according to the present invention comprises the steps of: forming a low dielectric constant film on a substrate; etching the low dielectric constant film by using, as a mask, a first resist film having an opening corresponding to a plug formation region to form a hole therein; removing the first resist film by ashing; coating a chemically amplified resist on the low dielectric constant film including the hole, while leaving, on at least a wall surface of the hole, resist residue produced in the step of removing the first resist film and exposing and developing the coated chemically amplified resist to form a second resist film having an opening corresponding to a wire formation region including a region formed with the hole; and etching the low dielectric constant film by using the second resist film as a mask to form a wiring groove connected to the hole.

The third method for fabricating an electronic device forms a hole in a low dielectric constant film, e.g., a carbon-containing silicon oxide film, forms a resist film having an opening corresponding to a wire formation region including a region formed with the hole, i.e., a resist film having a trench pattern by lithography using the chemically amplified resist, while leaving, on the wall surface of the hole, the resist residue produced in the hole forming step. This prevents direct contact between the resist and a carbon-containing silicon oxide film in the hole during the coating of the chemically amplified resist and thereby prevents the diffusion of amine or a basic material from the carbon-containing silicon oxide film in the resist, i.e., the resist poisoning phenomenon. As a result, a post-develop defect in the resist can be prevented and a resist film having a desired trench pattern can be formed so that a wire in a dual damascene structure is formed reliably.

In the third method for fabricating an electronic device, the resist residue is preferably left also on a portion of the low dielectric constant film located outside the hole in the step of forming the second resist film, the method preferably further comprising, between the step of forming the second resist film and the step of forming the wiring groove, the step of: removing the resist residue exposed in the opening of the second resist film.

The arrangement reliably prevents the resist poisoning phenomenon and prevents an increase in the resistance of a via plug. By removing the resist residue prior to the formation of the wiring groove, a load on etching for forming the wiring groove can be reduced so that an amount of resist etching is reduced by reducing the time required for the etching.

In the third method for fabricating an electronic device, the resist residue is preferably composed of a compound of $C_xF_y$ (where each of x and y is a natural number) and silicon.

The arrangement reliably prevents the resist poisoning phenomenon.

DETAILED DESCRIPTION OF THE INVENTION

Embodiment 1

A method for fabricating an electronic device according to a first embodiment of the present invention will be described with reference to the drawings.

FIGS. 1A to 1D and FIGS. 2A to 2E are cross-sectional views illustrating the individual process steps of the method for fabricating an electronic device according to the first embodiment.

Figure 1A:
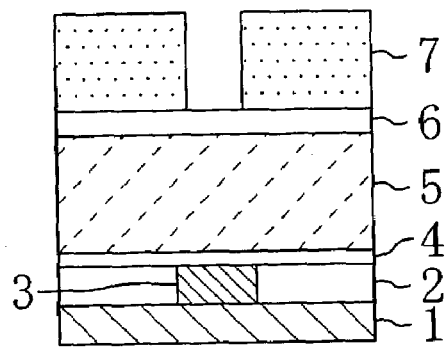
FIGS. 1A to 1D are cross-sectional views illustrating the individual process steps of a method for fabricating an electronic device according to a first embodiment of the present invention.

First, as shown in FIG. 1A, an interlayer insulating film 2 composed of, e.g., $SiO_2$ is deposited over the entire surface of a semiconductor substrate (Si substrate) 1 composed of, e.g., silicon.

Then, a first metal wire 3 is buried in the interlayer insulating film 2 and the upper surface of the interlayer insulating film 2 is planarized. Subsequently, a first protective film 4 composed of, e.g., SiN is formed over the planarized interlayer insulating film 2 and the first metal wire 3.

The first protective film 4 is formed to prevent the first metal wire 3 from being oxidized. As the material of the first metal wire 3, Cu or the like is used commonly. However, such a wiring material is a metal extremely prone to oxidation so that the first protective film 4 is required to prevent the situation in which an oxide film is formed on the surface of the first metal wire 3 to be brought in contact with a second metal wire 12 (see FIG. 2E) before the first metal wire 3 is connected to the second metal wire 12 in the subsequent step and a contact resistance is increased disadvantageously.

Next, as shown in FIG. 1A, a low dielectric constant film having a dielectric constant lower than that of a silicon oxide film, such as an organic-material-containing silicon oxide film (carbon-containing silicon oxide film) 5 composed of, e.g., SiOC with a thickness of about 400 nm, is deposited over the entire surface of the first protective film 4. Then, an antireflection film 6 composed of, e.g., SiON is formed over the entire surface of the organic-material-containing silicon oxide film 5. Subsequently, a resist film 7 having an opening corresponding to a via hole formation region, i.e., the resist film 7 having a via hole pattern is formed by lithography.

Figure 1B:
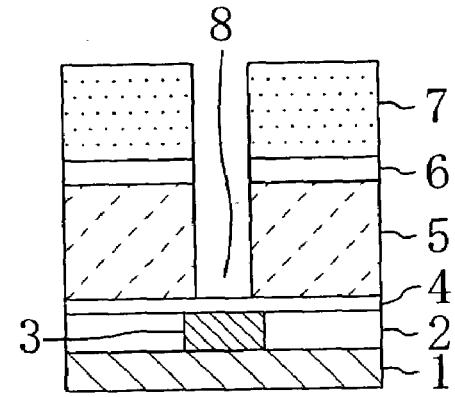

Then, as shown in FIG. 1B, dry etching using the resist film 7 as a mask is performed successively with respect to the antireflection film 6 and the organic-material-containing silicon oxide film 5, thereby forming a via hole 8.

Figure 1C:
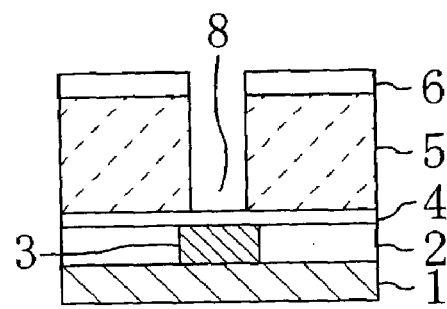

Subsequently, as shown in FIG. 1C, the resist film 7 is removed by ashing so that the antireflection film 6 is exposed. Thereafter, cleaning is performed with respect to the surface of the antireflection film 6 and to the inner surface of the via hole 8 to remove polymer residue and the like produced in the preceding etching step for forming the via hole 8.

Figure 1D:
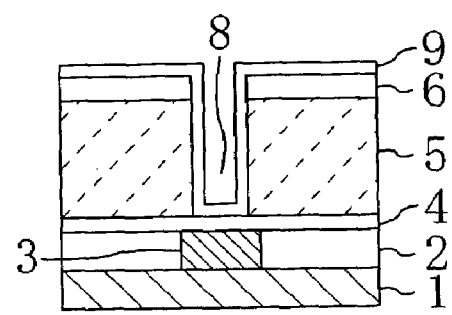

Next, as shown in FIG. 1D, an oxide film 9 (hereinafter referred to as a second protective film 9 in the present embodiment) composed of, e.g., $SiO_2$ with a thickness of about 30 nm is formed by CVD (chemical vapor deposition) so as to cover the entire inner surface (including the wall surface and the bottom surface) of the via hole 8 and the surface of the antireflection film 6. As a result, the organic-material-containing silicon oxide film 5 exposed at the wall surface of the via hole 8 is protected completely by the second protective film 9. The second protective film 9 is formed such that the via hole 8 is not filled completely therewith.

The reason that the second protective film 9 composed of an oxide film is required is as follows: If the organic-material-containing silicon oxide film 5 comes in direct contact with a chemically amplified positive resist used in the subsequent step (see FIG. 2A), amine or the like contained in the organic-material-containing silicon oxide film 5 reacts with a proton generated from the chemically amplified positive resist upon exposure so that the acid indispensable to excellent development of the resist is deactivated. If the phenomenon occurs, a resist pattern having a desired configuration cannot be formed. Hence, the protective film formed in the step shown in FIG. 1D, i.e., the second protective film 9 which prevents contact between the organic-material-containing silicon oxide film 5 and the resist plays an important role in forming a wire by using the organic-material-containing silicon oxide film.

Figure 2A:
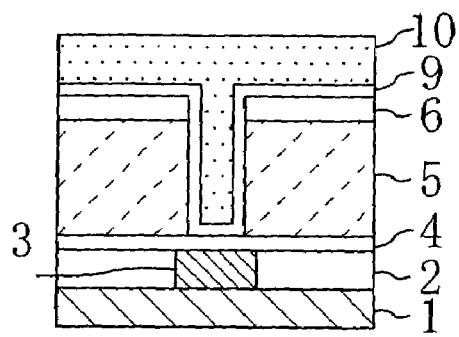
FIGS. 2A to 2E are cross-sectional views illustrating the individual process steps of the method for fabricating an electronic device according to the first embodiment.

Next, as shown in FIG. 2A, a resist film 10 composed of a chemically amplified positive resist is deposited over the entire surface of the second protective film 9 including the via hole 8. In the presence of the second protective film 9 formed in the preceding step, no direct contact occurs between the organic-material-containing silicon oxide film 5 and the resist film 10. Accordingly, the aforementioned phenomenon of acid deactivation does not occur so that the resist film 10 is not degenerated.

Figure 2D:
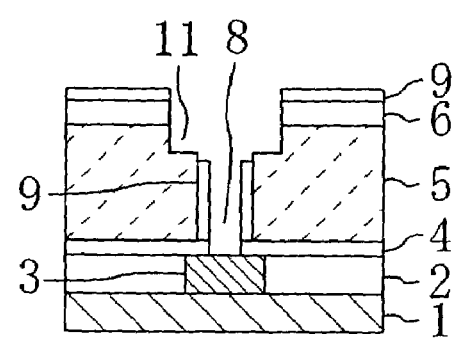
Figure 2B:
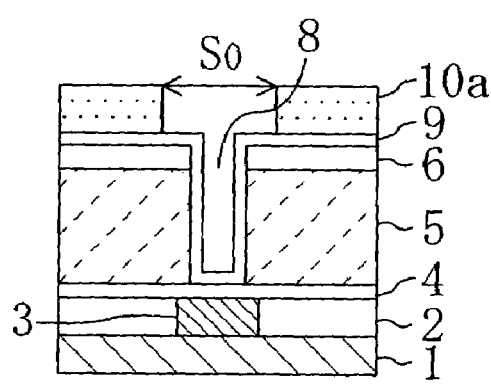

Then, as shown in FIG. 2B, an opening (trench pattern) with a width $S_0$ is formed in the portion of the resist film 10 located in the trench formation region by exposure using a photo mask having a trench pattern and development subsequent thereto, i.e., lithography, whereby the resist film 10 having the trench pattern, i.e., a resist pattern 10a is formed. The trench formation region includes a region formed with the via hole 8.

Figure 2E:
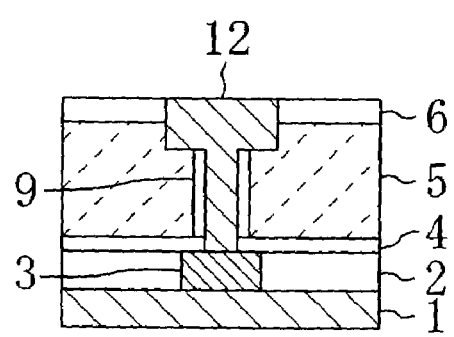
Figure 2C:
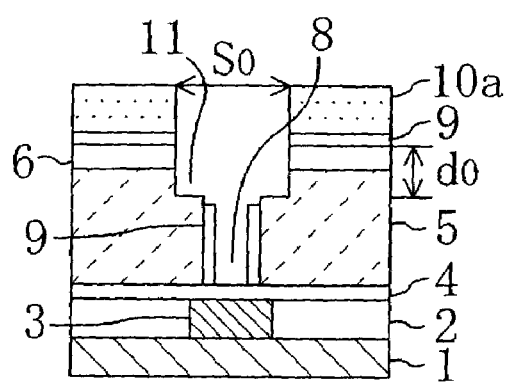

Subsequently, as shown in FIG. 2C, dry etching using the resist pattern 10a as a mask is performed successively with respect to the second protective film 9, the antireflection film 6, and the organic-material-containing silicon oxide film 5, thereby forming a trench (wiring groove) 11 at a depth (depth from the surface of the antireflection film 6) $d_0$ connecting to the via hole 8 in the organic-material-containing silicon oxide film 5 and in the antireflection film 6.

Then, as shown in FIG. 2D, the resist pattern 10a is removed by ashing such that the second protective film 9 on the antireflection film 6 is exposed. By further performing etching with respect to the portion of the first protective film 4 exposed in the via hole 8, an opening is formed in the portion and the upper surface of the first metal wire 3 is exposed therein.

Next, as shown in FIG. 2E, a second metal wire 12 having a dual damascene structure is formed in the via hole 8 and in the trench 11. A specific method for forming the second metal wire 12 is as follows: First, a barrier film (e.g., a multilayer film consisting of an upper-layer Ta film and a lower-layer TaN film) is deposited to cover the entire inner surface of the via hole 8 and the trench 11. The barrier film is formed such that the via hole 8 and the trench 11 are not filled completely therewith. Subsequently, a metal film such as a Cu film is deposited by, e.g., plating such that the via hole 8 and the trench 11 are filled completely therewith. Thereafter, an unneeded portion of the metal film located outside the via hole 8 and the trench 11 is removed by CMP (chemical mechanical polishing), while the second protective film 9 on the antireflection film 6 is removed, whereby the second metal wire 12 is formed in the via hole 8 and in the trench 11.

Thus, the first embodiment has formed the via hole 8 in the organic-material-containing silicon oxide film 5 and then formed the second protective film 9 on the wall surface of the via hole 8. Thereafter, the resist film 10 having a trench pattern (the resist pattern 10a having an opening corresponding to the trench formation region including the region formed with the via hole 8) is formed by lithography using the chemically amplified positive resist. This prevents direct contact between the resist and the organic-material-containing silicon oxide film 5 in the via hole 8 during the coating of the chemically amplified positive resist so that the diffusion of amine or a basic material from the organic-material-containing silicon oxide film 5 into the resist, i.e., a resist poisoning phenomenon is prevented. As a result, a post-develop defect in the resist can be prevented and hence the resist film 10 having a desired trench pattern, i.e., the resist pattern 10a without a trailing portion can be formed so that a wire in a dual damascene structure is formed reliably.

Since the first embodiment has formed the antireflection film 6 on the organic-material-containing silicon oxide film 5, lithography using the chemically amplified resist can be performed precisely. Since the first embodiment has also formed the second protective film 9 on the antireflection film 6, the resist poisoning phenomenon can be prevented reliably.

Although the first embodiment has formed the antireflection film 6 on the organic-material-containing silicon oxide film 5, the antireflection film 6 need not necessarily be formed. In this case, the second protective film 9 covers the entire exposed surface of the portion of the organic-material-containing silicon oxide film 5 located outside the via hole 8 and covers the entire inner surface of the via hole 8 including the side surfaces of the organic-material-containing silicon oxide film 5 exposed at the wall surface of the via hole 8. This prevents direct contact between the organic-material-containing silicon oxide film 5 and the resist film 10.

In the first embodiment, the second protective film 9 covering the wall surface of the via hole 8 may be removed after the formation of the trench 11. This prevents an increase in the resistance of a via plug formed in the via hole 8.

In the first embodiment, the material of the organic-material-containing silicon oxide film 5 is not particularly limited if it is lower in dielectric constant than a silicon oxide film. However, a wire-to-wire capacitance can be reduced positively if, e.g., SiOC is used. Instead of the organic-material-containing silicon oxide film 5, another low dielectric constant film, e.g., a porous film or the like may also be used.

In the first embodiment, the material of the second protective film 9 is not particularly limited if it can prevent the diffusion of amine or the like from the organic-material-containing silicon oxide film 5. If a no-carbon-containing silicon oxide film, e.g., is used, the resist poisoning phenomenon is prevented reliably.

Although the first embodiment has used the chemically amplified positive resist to form the resist film 10 (resist pattern 10a) having a trench pattern, a chemically amplified negative resist may also be used instead. In this case also, a resist film having a trench pattern without size increase, i.e., a resist pattern having an opening with desired dimensions over the trench formation region can be formed so that a wire in a dual damascene structure is formed reliably.

Embodiment 2

A method for fabricating an electronic device according to a second embodiment of the present invention will be described with reference to the drawings.

FIGS. 3A to 3E are cross-sectional views illustrating the individual process steps of the method for fabricating an electronic device according to the second embodiment.

In the second embodiment, the individual process steps of the method for fabricating an electronic device according to the first embodiment shown in FIGS. 1A to 1D are performed initially. Specifically, an interlayer insulating film 2, a first metal wire 3, a first protective film 4, a low dielectric constant film (specifically an organic-material-containing silicon oxide film) 5, an antireflection film 6, and a resist film 7 having a via hole pattern are formed successively on a semiconductor substrate 1, as shown in FIG. 1A. Then, as shown in FIG. 1B, a via hole 8 is formed in the antireflection film 6 and in the organic-material-containing silicon oxide film 5. After that, a via hole 8 is formed in the antireflection film 6 and in the organic-material-containing silicon oxide film 5, as shown in FIG. 1B, and then the resist film 7 is removed by ashing, as shown in FIG. 1C. Subsequently, an oxide film 9 is formed to cover the entire inner surface of the via hole 8 and the surface of the antireflection film 6, as shown in FIG. 1D.

Figure 3A:
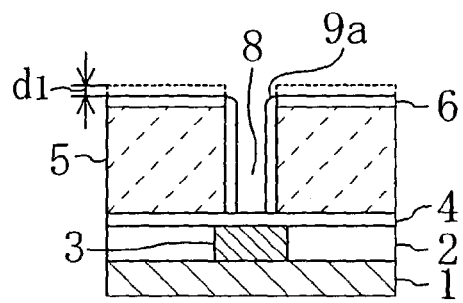
FIGS. 3A to 3E are cross-sectional views illustrating the individual process steps of a method for fabricating an electronic device according to a second embodiment of the present invention.

Then, as shown in FIG. 3A, an etch-back process is performed with respect to the oxide film 9 so that a sidewall 9a composed of the oxide film ($SiO_2$) is formed on the wall surface of the via hole 8, while the oxide film 9 on the antireflection film 6 is removed by etching. As a result, the organic-material-containing silicon oxide film 5 exposed at the wall surface of the via hole 8 can be protected by the sidewall 9a. Although the antireflection film 6 is etched slightly (by a thickness of, e.g., about $d_1$) in the etch-back process, the subsequent step is not greatly affected thereby.

Figure 3D:
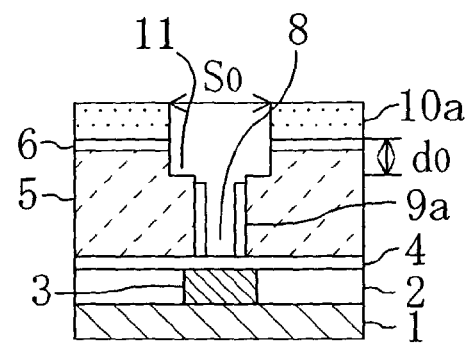
Figure 3B:
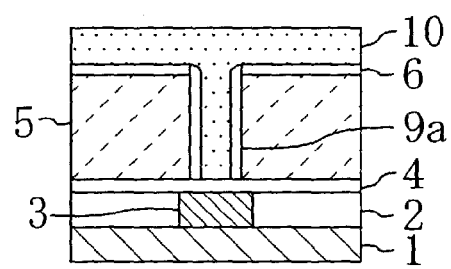

Next, as shown in FIG. 3B, a resist film 10 composed of a chemically amplified positive resist is coated over the entire surface of the antireflection film 6 including the via hole 8. In the presence of the sidewall 9a formed in the preceding step, no direct contact occurs between the organic-material-containing silicon oxide film 5 and the resist film 10 in the via hole 8. Since the antireflection film 6 is present also on the upper surface of the organic-material-containing silicon oxide film 5, no direct contact occurs between the organic-material-containing silicon oxide film 5 and the resist film 10 even outside the via hole 8. Accordingly, the phenomenon of acid deactivation described in the first embodiment does not occur so that the resist film 10 is not degenerated.

Figure 3E:
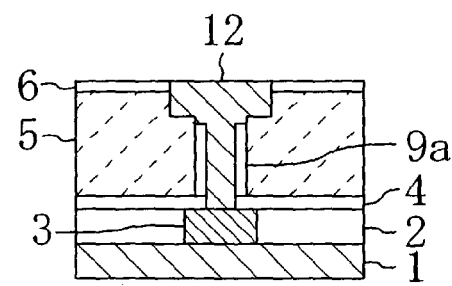
Figure 3C:
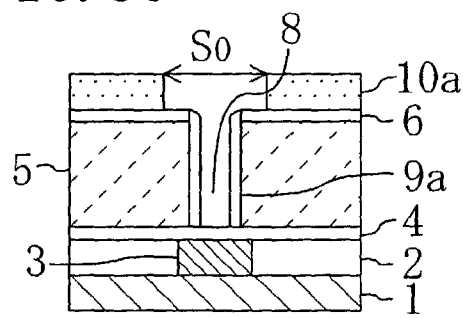

Then, as shown in FIG. 3C, an opening (trench pattern) with a width $S_0$ is formed in the portion of the resist film 10 located in the trench formation region by exposure using a photo mask having a trench pattern and development subsequent thereto, i.e., lithography, whereby the resist film 10 having the trench pattern, i.e., a resist pattern 10a is formed. The trench formation region includes a region formed with the via hole 8.

Subsequently, as shown in FIG. 3D, dry etching using the resist pattern 10a as a mask is performed successively with respect to the antireflection film 6 and the organic-material-containing silicon oxide film 5, thereby forming a trench (wiring groove) 11 at a depth (depth from the surface of the antireflection film 6) $d_0$ connecting to the via hole 8 in the organic-material-containing silicon oxide film 5 and in the antireflection film 6.

Then, as shown in FIG. 3E, the resist pattern 10a is removed by ashing. Subsequently, etching is further performed with respect to the portion of the first protective film 4 exposed in the via hole 8 so that an opening is formed in the portion and the upper surface of the first metal wire 3 is exposed thereby. Thereafter, a metal is buried in the via hole 8 and in the trench 11 in the same manner as in, e.g., the first embodiment, whereby a second metal wire 12 in a dual damascene structure is formed.

Thus, the second embodiment has formed the via hole 8 in the organic-material-containing silicon oxide film 5 and then formed the sidewall 9a serving as a protective film on the wall surface of the via hole 8. Thereafter, the resist film 10 having a trench pattern (the resist pattern 10a having an opening corresponding to the trench formation region including the region formed with the via hole 8) is formed by lithography using the chemically amplified positive resist. This prevents direct contact between the resist and the organic-material-containing silicon oxide film 5 in the via hole 8 during the coating of the chemically amplified positive resist so that the diffusion of amine or a basic material from the organic-material-containing silicon oxide film 5 into the resist, i.e., a resist poisoning phenomenon is prevented. As a result, a post-develop defect in the resist can be prevented and hence the resist film 10 having a desired trench pattern, i.e., the resist pattern 10a without a trailing portion can be formed so that a wire in a dual damascene structure is formed reliably.

Since the second embodiment has formed the antireflection film 6 on the organic-material-containing silicon oxide film 5, lithography using the chemically amplified resist can be performed precisely.

Since the second embodiment has preliminarily removed the portion of the oxide film 9 serving as the sidewall 9a which overlies the antireflection film 6, the following effect is achievable if a comparison is made between the etching step according to the first embodiment, which is shown in FIG. 2C, and the etching step according to the second embodiment, which is shown in FIG. 3D. That is, the second embodiment more greatly reduces a load on etching for forming the trench pattern than the first embodiment because the oxide film 9 does not exist on the antireflection film 6. This reduces the etching time and thereby reduces an amount of resist etching and the like.

Although the second embodiment has formed the antireflection film 6 on the organic-material-containing silicon oxide film 5, the antireflection film 6 need not necessarily be formed.

In the second embodiment, the sidewall 9a covering the wall surface of the via hole 8 may be removed after the formation of the trench 11. This prevents an increase in the resistance of a via plug formed in the via hole 8.

In the second embodiment, the material of the organic-material-containing silicon oxide film 5 is not particularly limited if it is lower in dielectric constant than a silicon oxide film. However, a wire-to-wire capacitance can be reduced positively if, e.g., SiOC is used. Instead of the organic-material-containing silicon oxide film 5, another low dielectric constant film, e.g., a porous film or the like may also be used.

In the second embodiment, the material of the sidewall 9a is not particularly limited if it can prevent the diffusion of amine or the like from the organic-material-containing silicon oxide film 5. If a no-carbon-containing silicon oxide film, e.g., is used, the resist poisoning phenomenon is prevented reliably.

Although the second embodiment has used the chemically amplified positive resist to form the resist film 10 (resist pattern 10a) having a trench pattern, a chemically amplified negative resist may also be used instead. In this case also, a resist film having a trench pattern without size increase, i.e., a resist pattern having an opening with desired dimensions over the trench formation region can be formed so that a wire in a dual damascene structure is formed reliably.

Embodiment 3

A method for fabricating an electronic device according to a third embodiment of the present invention will be described with reference to the drawings.

FIGS. 4A to 4E are cross-sectional views illustrating the individual process steps of the method for fabricating an electronic device according to the third embodiment.

In the third embodiment, the individual process steps of the method for fabricating an electronic device according to the first embodiment shown in FIGS. 1A to 1C are performed initially. Specifically, an interlayer insulating film 2, a first metal wire 3, a first protective film 4, a low dielectric constant film (specifically an organic-material-containing silicon oxide film) 5, an antireflection film 6, and a resist film 7 having a via hole pattern are formed successively on a semiconductor substrate 1, as shown in FIG. 1A. Then, as shown in FIG. 1B, a via hole 8 is formed in the antireflection film 6 and in the organic-material-containing silicon oxide film 5. After that, the resist film 7 is removed by ashing, as shown in FIG. 1C.

Figure 4A:
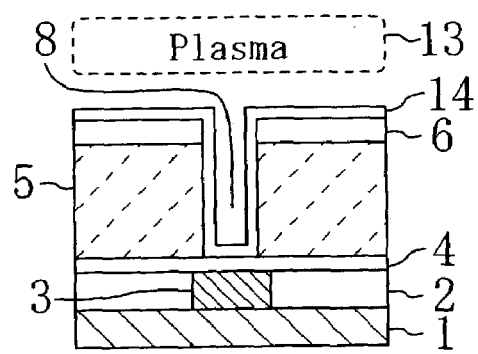
FIGS. 4A to 4E are cross-sectional views illustrating the individual process steps of a method for fabricating an electronic device according to a third embodiment of the present invention.

Next, a plasma discharge is performed with a fluorocarbon gas such as $C_4F_8$. By exposing the semiconductor substrate 1 to the plasma 13, as shown in FIG. 4A, a fluorocarbon film 14 (hereinafter referred to as a second protective film 14 in the present embodiment) is formed to cover the entire inner surface of the via hole 8 and the surface of the antireflection film 6. This allows the organic-material-containing silicon oxide film 5 exposed at the wall surface of the via hole 8 to be protected completely by the second protective film 14. The second protective film 14 is formed such that the via hole 8 is not filled completely therewith.

Figure 4D:
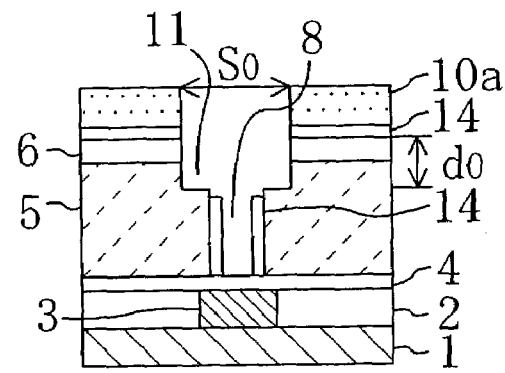
Figure 4B:
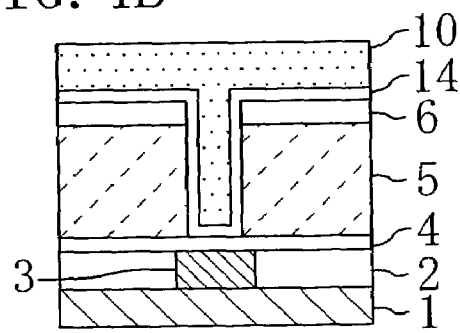

Next, as shown in FIG. 4B, a resist film 10 composed of a chemically amplified positive resist is coated tightly with no gap over the entire surface of the second protective film 14 including the via hole 8. In the presence of the second protective film 14 formed in the preceding step, no direct contact occurs between the organic-material-containing silicon oxide film 5 and the resist film 10. Accordingly, the phenomenon of acid deactivation described in the first embodiment does not occur so that the resist film 10 is not degenerated.

Figure 4E:
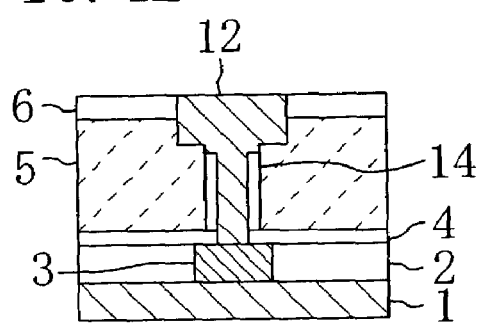
Figure 4C:
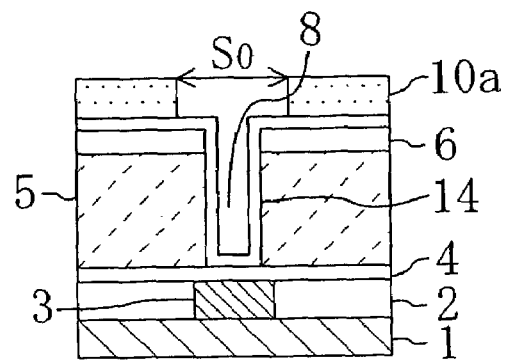

Then, as shown in FIG. 4C, an opening (trench pattern) with a width $S_0$ is formed in the portion of the resist film 10 located in the trench formation region by exposure using a photo mask having a trench pattern and development subsequent thereto, i.e., lithography, whereby the resist film 10 having the trench pattern, i.e., a resist pattern 10a is formed. The trench formation region includes a region formed with the via hole 8.

Subsequently, as shown in FIG. 4D, dry etching using the resist pattern 10a as a mask is performed successively with respect to the second protective film 14, the antireflection film 6, and the organic-material-containing silicon oxide film 5, thereby forming a trench (wiring groove) 11 at a depth (depth from the surface of the antireflection film 6) $d_0$ connecting to the via hole 8 in the organic-material-containing silicon oxide film 5 and in the antireflection film 6.

Then, as shown in FIG. 4E, the resist pattern 10a is removed by ashing. Subsequently, etching is further performed with respect to the portion of the first protective film 4 exposed in the via hole 8 so that an opening is formed in the portion and the upper surface of the first metal wire 3 is exposed thereby. Thereafter, a metal is buried in the via hole 8 and in the trench 11 in the same manner as in, e.g., the first embodiment, whereby a second metal wire 12 in a dual damascene structure is formed.

Thus, the third embodiment has formed the via hole 8 in the organic-material-containing silicon oxide film 5 and then formed the second protective film 14 composed of the fluorocarbon film on the wall surface of the via hole 8. Thereafter, the resist film 10 having a trench pattern (the resist pattern 10a having an opening corresponding to the trench formation region including the region formed with the via hole 8) is formed by lithography using the chemically amplified positive resist. This prevents direct contact between the resist and the organic-material-containing silicon oxide film 5 in the via hole 8 during the coating of the chemically amplified positive resist so that the diffusion of amine or a basic material from the organic-material-containing silicon oxide film 5 into the resist, i.e., a resist poisoning phenomenon is prevented. As a result, a post-develop defect in the resist can be prevented and hence the resist film 10 having a desired trench pattern, i.e., the resist pattern 10a without a trailing portion can be formed so that a wire in a dual damascene structure is formed reliably.

Since the third embodiment has formed the antireflection film 6 on the organic-material-containing silicon oxide film 5, lithography using the chemically amplified resist can be performed precisely. Since the first embodiment has also formed the second protective film 14 on the antireflection film 6, the resist poisoning phenomenon is prevented reliably.

Although the third embodiment has formed the antireflection film 6 on the organic-material-containing silicon oxide film 5, the antireflection film 6 need not necessarily be formed. In this case, the second protective film 14, i.e., the fluorocarbon film covers, with excellent adhesion, the entire exposed surface of the portion of the organic-material-containing silicon oxide film 5 located outside the via hole 8 and covers the entire inner surface of the via hole 8 including the side surfaces of the organic-material-containing silicon oxide film 5 exposed at the wall surface of the via hole 8. This prevents direct contact between the organic-material-containing silicon oxide film 5 and the resist film 10.

In the third embodiment, the second protective film 14 covering the wall surface of the via hole 8 may be removed after the formation of the trench 11. This prevents an increase in the resistance of a via plug formed in the via hole 8.

In the third embodiment, the material of the organic-material-containing silicon oxide film 5 is not particularly limited if it is lower in dielectric constant than a silicon oxide film. However, a wire-to-wire capacitance can be reduced positively if, e.g., SiOC is used. Instead of the organic-material-containing silicon oxide film 5, another low dielectric constant film, e.g., a porous film or the like may also be used.

Although the third embodiment has used the $C_4F_8$ gas as a material gas in the plasma process for forming the second protective film 14, i.e., the fluorocarbon film, the same effects are achievable if another fluorocarbon gas containing fluorine and carbon such as $C_3F_6$ gas, $C_5F_8$ gas, or $CHF_3$ gas is used instead.

Although the third embodiment has used the chemically amplified positive resist to form the resist film 10 (resist pattern 10a) having a trench pattern, a chemically amplified negative resist may also be used instead. In this case also, a resist film having a trench pattern without size increase, i.e., a resist pattern having an opening with desired dimensions over the trench formation region can be formed so that a wire in a dual damascene structure is formed reliably.

Embodiment 4

A method for fabricating an electronic device according to a fourth embodiment of the present invention will be described with reference to the drawings.

FIGS. 5A to 5E are cross-sectional views illustrating the individual process steps of the method for fabricating an electronic device according to the fourth embodiment.

In the fourth embodiment, the individual process steps of the method for fabricating an electronic device according to the first embodiment shown in FIGS. 1A to 1C are performed initially. Specifically, an interlayer insulating film 2, a first metal wire 3, a first protective film 4, a low dielectric constant film (specifically an organic-material-containing silicon oxide film) 5, an antireflection film 6, and a resist film 7 having a via hole pattern are formed successively on a semiconductor substrate 1, as shown in FIG. 1A. Then, as shown in FIG. 1B, a via hole 8 is formed in the antireflection film 6 and in the organic-material-containing silicon oxide film 5. After that, the resist film 7 is removed by ashing, as shown in FIG. 1C.

Figure 5A:
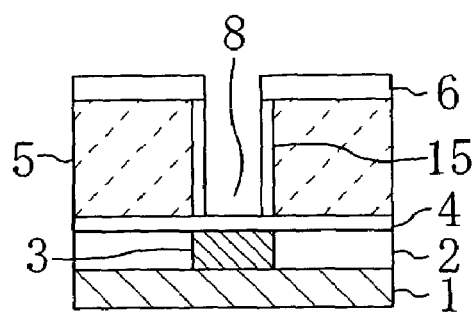
FIGS. 5A to 5E are cross-sectional views illustrating the individual process steps of a method for fabricating an electronic device according to a fourth embodiment of the present invention.

Next, as shown in FIG. 5A, ashing using, e.g., an $O_2$ gas is performed with respect to the portion of the organic-material-containing silicon oxide film 5 exposed at the wall surface of the via hole 8, thereby increasing the density of the organic-material-containing silicon oxide film 5 (specifically, changing the organic-material-containing silicon oxide film 5 into $SiO_2$) forming the wall portion of the via hole 8 and forming a surface modified layer 15. The surface modified layer 15 functions as a protective film, which is similar to the second protective film 9 according to the first embodiment, with respect to the organic-material-containing silicon oxide film 5 covered therewith.

Figure 5D:
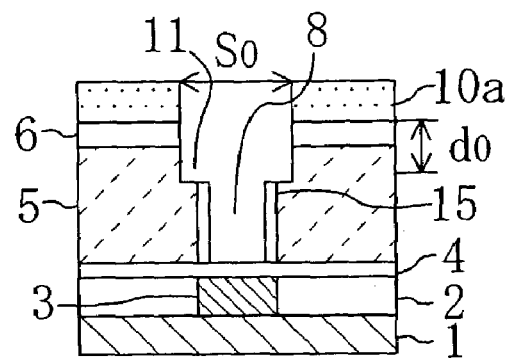
Figure 5B:
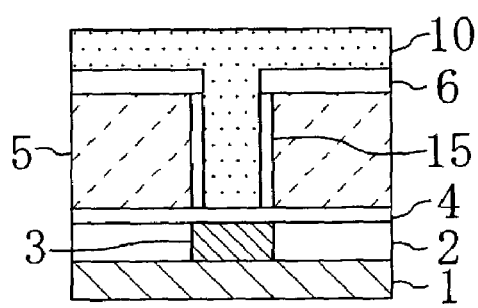

Next, as shown in FIG. 5B, a resist film 10 composed of a chemically amplified positive resist is deposited over the entire surface of the antireflection film 6 including the via hole 8. In the presence of the surface modified layer 15 formed in the preceding step, no direct contact occurs between the organic-material-containing silicon oxide film 5 and the resist film 10 in the via hole 8. Since the antireflection film 6 is present also on the upper surface of the organic-material-containing silicon oxide film 5, no direct contact occurs between the organic-material-containing silicon oxide film 5 and the resist film 10 even outside the via hole 8. Accordingly, the phenomenon of acid deactivation described in the first embodiment does not occur so that the resist film 10 is not degenerated.

Figure 5E:
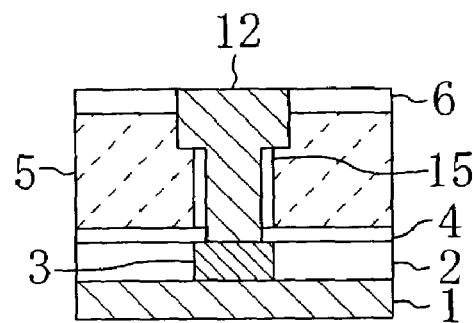
Figure 5C:
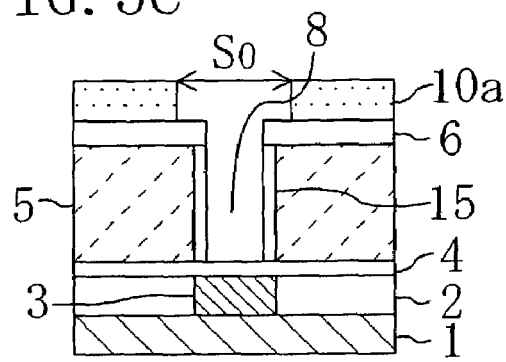

Then, as shown in FIG. 5C, an opening (trench pattern) with a width $S_0$ is formed in the portion of the resist film 10 located in the trench formation region by exposure using a photo mask having a trench pattern and development subsequent thereto, i.e., lithography, whereby the resist film 10 having the trench pattern, i.e., a resist pattern 10a is formed. The trench formation region includes a region formed with the via hole 8.

Subsequently, as shown in FIG. 5D, dry etching using the resist pattern 10a as a mask is performed successively with respect to the antireflection film 6 and the organic-material-containing silicon oxide film 5, thereby forming a trench (wiring groove) 11 at a depth (depth from the surface of the antireflection film 6) $d_0$ connecting to the via hole 8 in the organic-material-containing silicon oxide film 5 and in the antireflection film 6.

Then, as shown in FIG. 5E, the resist pattern 10a is removed by ashing. Subsequently, etching is further performed with respect to the portion of the first protective film 4 exposed in the via hole 8 so that an opening is formed in the portion and the upper surface of the first metal wire 3 is exposed thereby. Thereafter, a metal is buried in the via hole 8 and in the trench 11 in the same manner as in, e.g., the first embodiment, whereby a second metal wire 12 in a dual damascene structure is formed.

Thus, the fourth embodiment has formed the via hole 8 in the organic-material-containing silicon oxide film 5 and then formed the surface modified layer 15 serving as a protective film on the wall surface of the via hole 8. Thereafter, the resist film 10 having a trench pattern (the resist pattern 10a having an opening corresponding to the trench formation region including the region formed with the via hole 8) is formed by lithography using the chemically amplified positive resist. This prevents direct contact between the resist and the organic-material-containing silicon oxide film 5 in the via hole 8 during the coating of the chemically amplified positive resist so that the diffusion of amine or a basic material from the organic-material-containing silicon oxide film 5 in the resist, i.e., a resist poisoning phenomenon is prevented. As a result, a post-develop defect in the resist can be prevented and hence the resist film 10 having a desired trench pattern, i.e., the resist pattern 10a without a trailing portion can be formed so that a wire in a dual damascene structure is formed reliably.

Since the fourth embodiment has formed the antireflection film 6 on the organic-material-containing silicon oxide film 5, lithography using the chemically amplified resist can be performed precisely.

Although the fourth embodiment has formed the antireflection film 6 on the organic-material-containing silicon oxide film 5, the antireflection film 6 need not necessarily be formed.

In the fourth embodiment, the surface modified layer 15 covering the wall surface of the via hole 8 may be removed after the formation of the trench 11. This prevents an increase in the resistance of a via plug formed in the via hole S.

In the fourth embodiment, the material of the organic-material-containing silicon oxide film 5 is not particularly limited if it is lower in dielectric constant than a silicon oxide film. However, a wire-to-wire capacitance can be reduced positively if, e.g., SiOC is used. Instead of the organic-material-containing silicon oxide film 5, another low dielectric constant film, e.g., a porous film or the like may also be used.

Although the fourth embodiment has formed the surface modified layer 15 by changing the organic-material-containing silicon oxide film 5 into $SiO_2$ by ashing, it is also possible to increase the density of the organic-material-containing silicon oxide film 5 by another method to form a surface modified layer.

Although the fourth embodiment has used the chemically amplified positive resist to form the resist film 10 (resist pattern 10a) having a trench pattern, a chemically amplified negative resist may also be used instead. In this case also, a resist film having a trench pattern without size increase, i.e., a resist pattern having an opening with desired dimensions over the trench formation region can be formed so that a wire in a dual damascene structure is formed reliably.

Embodiment 5

A method for fabricating an electronic device according to a fifth embodiment of the present invention will be described with reference to the drawings.

FIGS. 6A to 6H are cross-sectional views illustrating the individual process steps of the method for fabricating an electronic device according to the fifth embodiment.

Figure 6A:
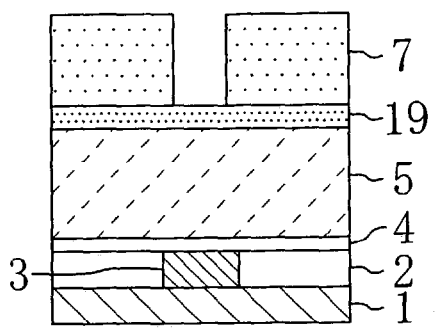
FIGS. 6A to 6H are cross-sectional views illustrating the individual process steps of a method for fabricating an electronic device according to a fifth embodiment of the present invention.

First, as shown in FIG. 6A, an interlayer insulating film 2 composed of, e.g., $SiO_2$ is deposited over the entire surface of a semiconductor substrate 1 in the same manner as in the step shown in FIG. 1A. Then, a first metal wire 3 is buried in the interlayer insulating film 2 and the upper surface of the interlayer insulating film 2 is planarized. Subsequently, a first protective film 4 composed of, e.g., SiN is formed over the planarized interlayer insulating film 2 and the first metal wire 3. Then, a low dielectric constant film, such as an organic-material-containing silicon oxide film (carbon-containing silicon oxide film) 5 composed of, e.g., SiOC with a thickness of about 400 nm, is deposited over the entire surface of the first protective film 4. Then, an antireflection film 19 composed of, e.g., an organic material is formed over the entire surface of the organic-material-containing silicon oxide film 5. Subsequently, a resist film 7 having an opening corresponding to a via hole formation region, i.e., the resist film 7 having a via hole pattern is formed by lithography.

Figure 6E:
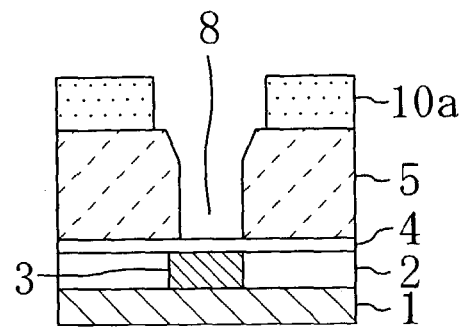
Figure 6B:
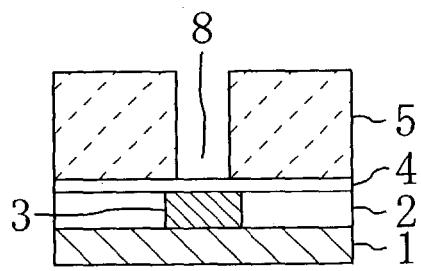

Then, as shown in FIG. 6B, dry etching using the resist film 7 as a mask is performed successively with respect to the antireflection film 19 and the organic-material-containing silicon oxide film 5, thereby forming a via hole 8. The resist film 7 and the antireflection film 19 are removed by ashing after the formation of the via hole 8.

Figure 6F:
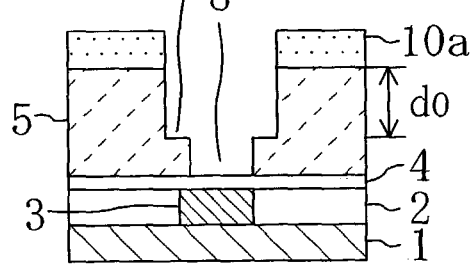
Figure 6C:
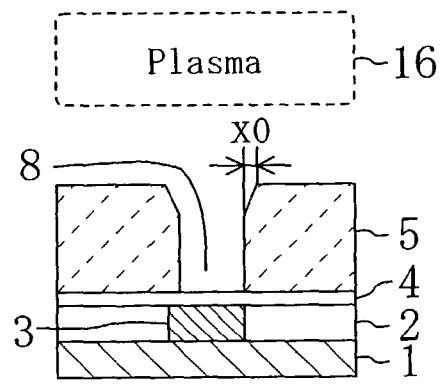

Next, as shown in FIG. 6C, ions each having a positive charge are caused to be implanted in or adsorbed by the surface of the organic-material-containing silicon oxide film 5 by exposing the semiconductor substrate 1 to a plasma 16. This causes an acid-base reaction between the ions each having a positive charge implanted in or adsorbed by the organic-material-containing silicon oxide film 5 by the plasma process and amine or a basic material in the organic-material-containing silicon oxide film 5 (especially in the wall portion of the via hole 8). Accordingly, the amine or basic material in the organic-material-containing silicon oxide film 5 is neutralized or the concentration of the amine or the like is reduced. Although the upper portion of the via hole 8 undergoes a slight size enlargement (by the magnitude of, e.g., the width $x_0$), the size enlargement of the upper portion of the via hole 8 does not present a problem if size control is performed in the subsequent step of forming a trench pattern (see FIG. 6E).

Figure 6G:
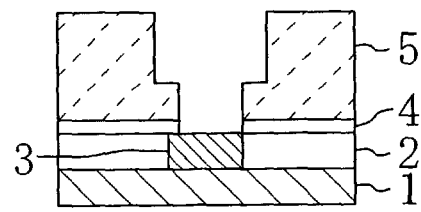
Figure 6D:
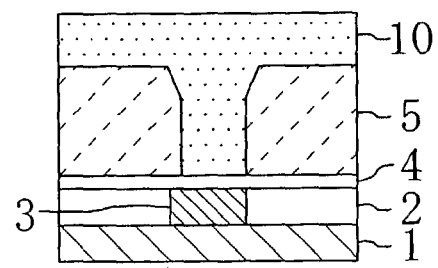

Next, as shown in FIG. 6D, a resist film 10 composed of a chemically amplified positive resist is deposited over the entire surface of the organic-material-containing silicon oxide film 5 including the via hole 8. Since the concentration of the amine or basic material in the organic-material-containing silicon oxide film 5 has been reduced by the previous plasma process, the deactivation of an acid generated from the resist film 10 upon exposure is prevented so that the resist film 10 is not degenerated.

Then, as shown in FIG. 6E, an opening (trench pattern) is formed in the portion of the resist film 10 located in the trench formation region by exposure using a photo mask having a trench pattern and development subsequent thereto, i.e., lithography, whereby the resist film 10 having the trench pattern, i.e., a resist pattern 10a is formed. The trench formation region includes a region formed with the via hole 8.

Subsequently, as shown in FIG. 6F, dry etching using the resist pattern 10a as a mask is performed with respect to the organic-material-containing silicon oxide film 5, thereby forming a trench (wiring groove) 11 at a depth $d_0$ connecting to the via hole 8 in the organic-material-containing silicon oxide film 5.

Then, as shown in FIG. 6G, the resist pattern 10a is removed by ashing. Thereafter, etching is performed with respect to the portion of the first protective film 4 exposed in the via hole 8 so that an opening is formed in the portion and the upper surface of the first metal wire 3 is exposed thereby.

Figure 6H:
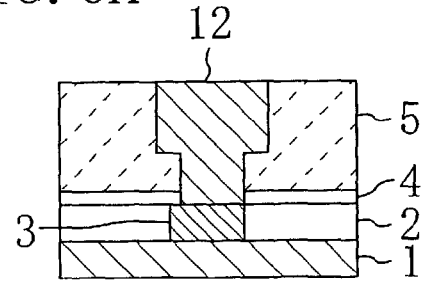

Next, as shown in FIG. 6H, a metal is buried in the via hole 8 and in the trench 11 by the same method as used in, e.g., the first embodiment so that a second metal wire 12 having a dual damascene structure is formed therein.

Thus, the fifth embodiment has formed the via hole 8 in the organic-material-containing silicon oxide film 5 and then caused ions each having a positive charge to be implanted in or adsorbed by the organic-material-containing silicon oxide film 5 including the wall portion of the via hole 8. Thereafter, the resist film 10 having a trench pattern (the resist pattern 10a having an opening corresponding to the trench formation region including the region formed with the via hole 8) is formed by lithography using the chemically amplified positive resist. This causes an acid-base reaction between the ions each having a positive charge implanted in or adsorbed by the organic-material-containing silicon oxide film 5 and the amine or basic material in the organic-material-containing silicon oxide film 5 and thereby neutralizes the amine or basic material in the organic-material-containing silicon oxide film 5 or reduces the concentration of the amine or the like therein. Even if the organic-material-containing silicon oxide film 5 is in direct contact with the chemically amplified resist, the deactivation of an acid generated from the chemically amplified resist upon exposure is prevented. As a result, a post-develop defect in the resist can be prevented and hence the resist film 10 having a desired trench pattern, i.e., the resist pattern 10a without a trailing portion can be formed so that a wire in a dual damascene structure is formed reliably.

The fifth embodiment also achieves the following effect by implanting the ions each having a positive charge into the organic-material-containing silicon oxide film 5 by using the plasma 16. As a gas for forming the plasma 16 containing positive charges, various gases including a $Cl_2$ gas which generates $Cl^+$ cations in a plasma state can be used. When the semiconductor substrate 1 is exposed to the plasma 16, the cations can be implanted easily into the organic-material-containing silicon oxide film 5 by placing the semiconductor substrate 1 on the cathode. In short, the fifth embodiment can basically achieve the effect of preventing the resist poisoning phenomenon by using any gas.

In the fifth embodiment, the material of the organic-material-containing silicon oxide film 5 is not particularly limited if it is lower in dielectric constant than a silicon oxide film. However, a wire-to-wire capacitance can be reduced positively if, e.g., SiOC is used. Instead of the organic-material-containing silicon oxide film 5, another low dielectric constant film, e.g., a porous film or the like may also be used.

Although the fifth embodiment has removed the antireflection film 19 on the organic-material-containing silicon oxide film 5 therefrom after the formation of the via hole 8, if an antireflection film composed of, e.g., SiON is used instead of the antireflection film 19 composed of an organic material, the antireflection film is left. This allows lithography using the chemically amplified resist to be performed precisely during the formation of the trench pattern.

Although the fifth embodiment has caused ions each having a positive charge to be implanted in or adsorbed by the surface of the organic-material-containing silicon oxide film 5, the same effects are achievable if another electron acceptor is caused to be implanted in or adsorbed by the surface of the organic-material-containing silicon oxide film 5 instead of the ions each having a positive charge.

Although the fifth embodiment has used the chemically amplified positive resist to form the resist film 10 (resist pattern 10a) having a trench pattern, a chemically amplified negative resist may also be used instead. In this case also, a resist film having a trench pattern without size increase, i.e., a resist pattern having an opening with desired dimensions over the trench formation region can be formed so that a wire in a dual damascene structure is formed reliably.

Embodiment 6

A method for fabricating an electronic device according to a sixth embodiment of the present invention will be described with reference to the drawings.

FIGS. 7A to 7H are cross-sectional views illustrating the individual process steps of the method for fabricating an electronic device according to the sixth embodiment.

Figure 7A:
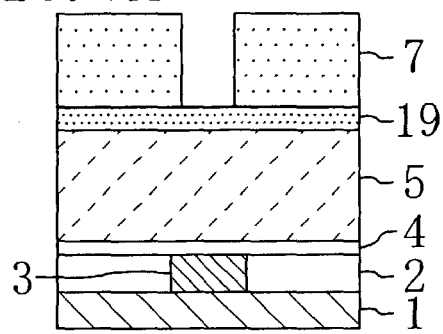
FIGS. 7A to 7H are cross-sectional views illustrating the individual process steps of a method for fabricating an electronic device according to a sixth embodiment of the present invention.

First, as shown in FIG. 7A, an interlayer insulating film 2 composed of, e.g., $SiO_2$ is deposited over the entire surface of a semiconductor substrate 1 in the same manner as in the step shown in FIG. 1A. Then, a first metal wire 3 is buried in the interlayer insulating film 2 and the upper surface of the interlayer insulating film 2 is planarized. Subsequently, a first protective film 4 composed of, e.g., SiN is formed over the planarized interlayer insulating film 2 and the first metal wire 3. Then, a low dielectric constant film, such as an organic-material-containing silicon oxide film (carbon-containing silicon oxide film) 5 composed of, e.g., SiOC with a thickness of about 400 nm, is deposited over the entire surface of the first protective film 4. Then, an antireflection film 19 composed of, e.g., an organic material is formed over the entire surface of the organic-material-containing silicon oxide film 5. Subsequently, a resist film 7 having an opening corresponding to a via hole formation region, i.e., the resist film 7 having a via hole pattern is formed by lithography.

Figure 7B:
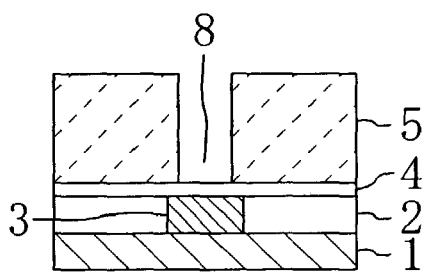

Then, as shown in FIG. 7B, dry etching using the resist film 7 as a mask is performed successively with respect to the antireflection film 19 and the organic-material-containing silicon oxide film 5, thereby forming a via hole 8. The resist film 7 and the antireflection film 19 are removed by ashing after the formation of the via hole 8.

Figure 7C:
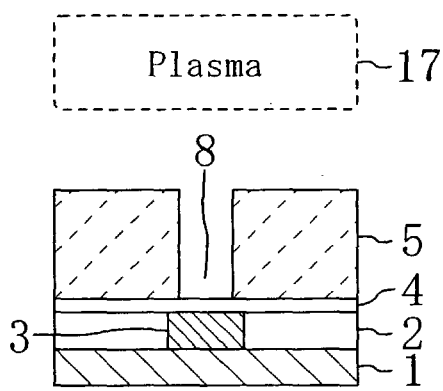

Next, as shown in FIG. 7C, $H^+$ ions or $OH^+$ ions are caused to be implanted in or adsorbed by the surface of the organic-material-containing silicon oxide film 5 by exposing the semiconductor substrate to a plasma 17 composed of a $H_2$ gas, a $H_2O$ gas, or a gas containing the $H_2$ gas or the $H_2O$ gas as a main component. This causes an acid-base reaction between the $H^+$ ions or the $OH^+$ ions implanted in or adsorbed by the organic-material-containing silicon oxide film 5 by the plasma process and amine or a basic material in the organic-material-containing silicon oxide film 5 (especially in the wall portion of the via hole 8). Accordingly, the amine or basic material in the organic-material-containing silicon oxide film 5 is neutralized or the concentration of the amine or the like is reduced. Since the ions implanted into the organic-material-containing silicon oxide film 5 by the foregoing plasma process are $H^+$ ions or $OH^+$ ions which are small in mass, the sputtering effect thereof is low so that the size enlargement of the upper portion of the via hole 8 observed in the fifth embodiment (see FIG. 6C) does not occur. Since the $H^+$ ions or the $OH^+$ ions are small in mass, plasma damage to the semiconductor substrate 1, particularly plasma damage to the organic-material-containing silicon oxide film 5, can be minimized.

Figure 7D:
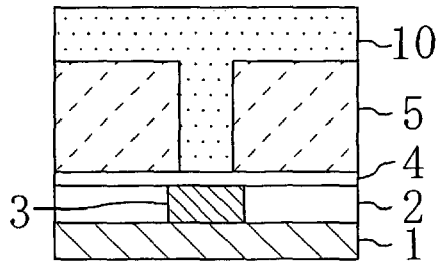

Next, as shown in FIG. 7D, a resist film 10 composed of a chemically amplified positive resist is coated over the entire surface of the organic-material-containing silicon oxide film 5 including the via hole 8. Since the concentration of the amine or basic material in the organic-material-containing silicon oxide film 5 has been reduced by the previous plasma process, the deactivation of an acid generated from the resist film 10 upon exposure is prevented so that the resist film 10 is not degenerated.

Figure 7E:
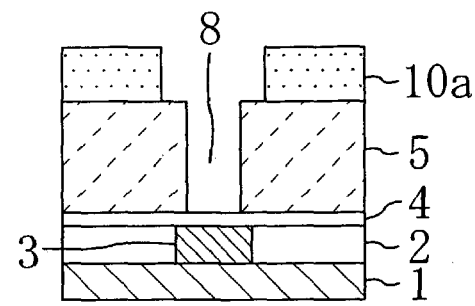

Then, as shown in FIG. 7E, an opening (trench pattern) is formed in the portion of the resist film 10 located in the trench formation region by exposure using a photo mask having a trench pattern and development subsequent thereto, i.e., lithography, whereby the resist film 10 having the trench pattern, i.e., a resist pattern 10a is formed. The trench formation region includes a region formed with the via hole 8.

Figure 7F:
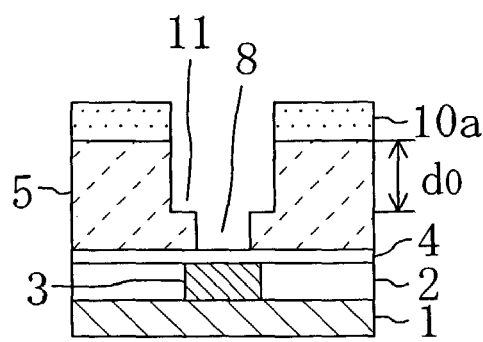

Subsequently, as shown in FIG. 7F, dry etching using the resist pattern 10a as a mask is performed with respect to the organic-material-containing silicon oxide film 5, thereby forming a trench (wiring groove) 11 at a depth $d_0$ connecting to the via hole 8 in the organic-material-containing silicon oxide film 5.

Figure 7G:
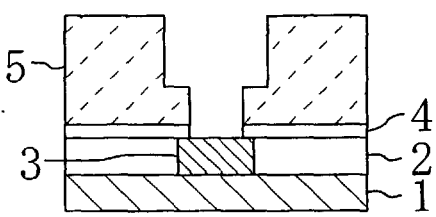

Then, as shown in FIG. 7G, the resist pattern 10a is removed by ashing. Thereafter, etching is performed with respect to the portion of the first protective film 4 exposed in the via hole 8 so that an opening is formed in the portion and the upper surface of the first metal wire 3 is exposed thereby.

Figure 7H:
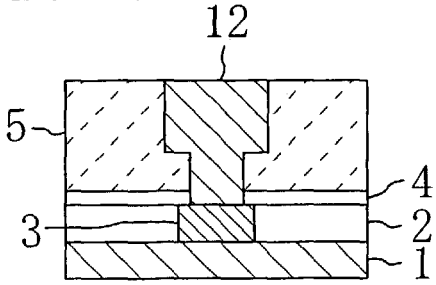

Next, as shown in FIG. 7H, a metal is buried in the via hole 8 and in the trench 11 by the same method as used in, e.g., the first embodiment so that a second metal wire 12 having a dual damascene structure is formed therein.

Thus, the sixth embodiment has formed the via hole 8 in the organic-material-containing silicon oxide film 5 and then caused $H^+$ ions or $OH^+$ ions to be implanted in or adsorbed by the organic-material-containing silicon oxide film 5 including the wall portion of the via hole 8. Thereafter, the resist film 10 having a trench pattern (the resist pattern 10a having an opening corresponding to the trench formation region including the region formed with the via hole 8) is formed by lithography using the chemically amplified positive resist. This causes an acid-base reaction between the $H^+$ ions or the $OH^+$ ions implanted in or adsorbed by the organic-material-containing silicon oxide film 5 and the amine or basic material in the organic-material-containing silicon oxide film 5 and thereby neutralizes the amine or basic material in the organic-material-containing silicon oxide film 5 or reduces the concentration of the amine or the like therein. Even if the organic-material-containing silicon oxide film 5 is in direct contact with the chemically amplified resist, the deactivation of an acid generated from the chemically amplified resist upon exposure is prevented. As a result, a post-develop defect in the resist can be prevented and hence the resist film 10 having a desired trench pattern, i.e., the resist pattern 10a without a trailing portion can be formed so that a wire in a dual damascene structure is formed reliably.

Since the $H^+$ ions or $OH^+$ ions which are small in mass are implanted in the organic-material-containing silicon oxide film 5 in the sixth embodiment, the size enlargement of the upper portion of the via hole 8 can be prevented. In addition, plasma damage to the semiconductor substrate 1, particularly plasma damage to the organic-material-containing silicon oxide film 5, can be minimized.

In the sixth embodiment, the material of the organic-material-containing silicon oxide film 5 is not particularly limited if it is lower in dielectric constant than a silicon oxide film. However, a wire-to-wire capacitance can be reduced positively if, e.g., SiOC is used. Instead of the organic-material-containing silicon oxide film 5, another low dielectric constant film, e.g., a porous film or the like may also be used.

Although the sixth embodiment has removed the antireflection film 19 on the organic-material-containing silicon oxide film 5 therefrom after the formation of the via hole 8, if an antireflection film composed of, e.g., SiON is used instead of the antireflection film 19 composed of an organic material, the antireflection film is left. This allows lithography using the chemically amplified resist to be performed precisely during the formation of the trench pattern.

Although the sixth embodiment has used the chemically amplified positive resist to form the resist film 10 (resist pattern 10a) having a trench pattern, a chemically amplified negative resist may also be used instead. In this case also, a resist film having a trench pattern without size increase, i.e., a resist pattern having an opening with desired dimensions over the trench formation region can be formed so that a wire in a dual damascene structure is formed reliably.

Embodiment 7

A method for fabricating an electronic device according to a seventh embodiment of the present invention will be described with reference to the drawings.

FIGS. 8A to 8E are cross-sectional views illustrating the individual process steps of the method for fabricating an electronic device according to the seventh embodiment.

In the seventh embodiment, the individual process steps of the method for fabricating an electronic device according to the first embodiment shown in FIGS. 1A to 1C are performed initially. Specifically, an interlayer insulating film 2, a first metal wire 3, a first protective film 4, a low dielectric constant film (specifically an organic-material-containing silicon oxide film) 5, an antireflection film 6, and a resist film 7 having a via hole pattern are formed successively on a semiconductor substrate 1, as shown in FIG. 1A.

Then, as shown in FIG. 1B, a via hole 8 is formed in the antireflection film 6 and in the organic-material-containing silicon oxide film 5. After that, the resist film 7 is removed by ashing, as shown in FIG. 1C.

Figure 8A:
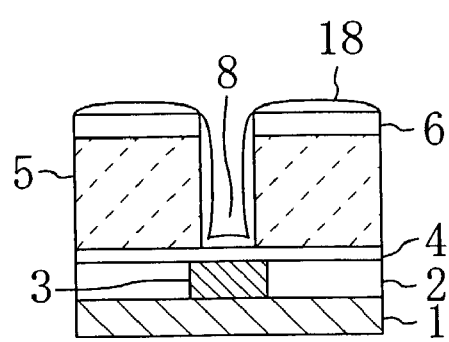
FIGS. 8A to 8E are cross-sectional views illustrating the individual process steps of a method for fabricating an electronic device according to a seventh embodiment of the present invention.

The present embodiment does not perform cleaning for removing resist residue such as a polymer generated in the step of forming the via hole 8 by etching. Specifically, resist residue 18 is left on the entire inner surface of the via hole 8 and on the entire surface of antireflection film 6, as shown in FIG. 8A. Since etching for forming the via hole 8 is performed with respect to the entire surface of the substrate, the resist residue 18 is attached tightly to the entire inner surface of the via hole 8 with no gap. The resist residue 18 is a product derived from a fluorocarbon gas such as $C_4F_8$ used in the etching step for forming the via hole 8 and, specifically, a compound of $C_xF_y$ (each of x and y is a natural number) and silicon. The present embodiment utilizes the resist residue 18 as a protective film for the organic-material-containing silicon oxide film 5 which is similar to the second protective film 9 according to the first embodiment.

Figure 8D:
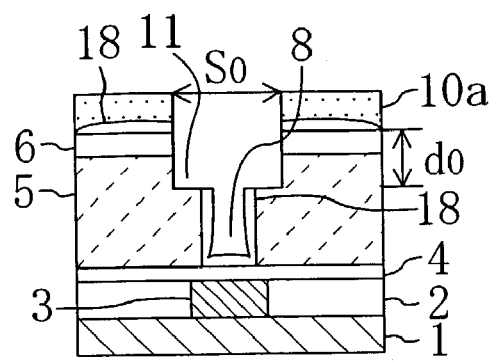
Figure 8B:
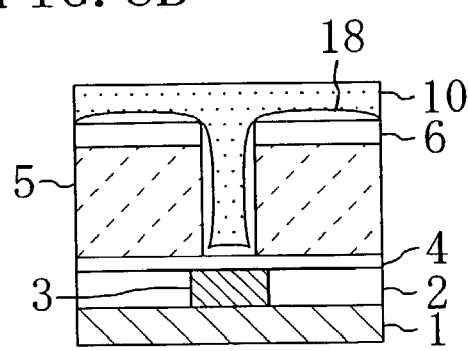

Next, as shown in FIG. 8B, a resist film 10 composed of a chemically amplified positive resist is coated tightly with no gap over the entire surface of the resist residue 18 including the via hole 8. In the presence of the resist residue 18 left after the etching for forming the via hole 8, no direct contact occurs between the organic-material-containing silicon oxide film 5 and the resist film 10. Accordingly, the phenomenon of acid deactivation described in the first embodiment does not occur so that the resist film 10 is not degenerated.

Figure 8E:
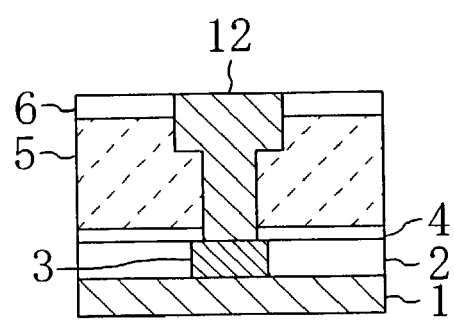
Figure 8C:
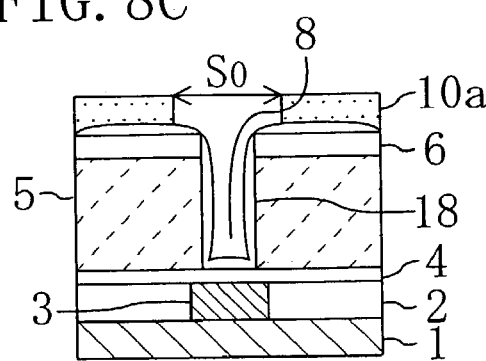

Then, as shown in FIG. 8C, an opening (trench pattern) with a width $S_0$ is formed in the portion of the resist film 10 located in the trench formation region by exposure using a photo mask having a trench pattern and development subsequent thereto, i.e., lithography, whereby the resist film 10 having the trench pattern, i.e., a resist pattern 10a is formed. The trench formation region includes a region formed with the via hole 8.

Subsequently, as shown in FIG. 8D, dry etching using the resist pattern 10a as a mask is performed successively with respect to the resist residue 18, the antireflection film 6, and the organic-material-containing silicon oxide film 5, thereby forming a trench (wiring groove) 11 at a depth (depth from the surface of the antireflection film 6) $d_0$ connecting to the via hole 8 in the organic-material-containing silicon oxide film 5 and in the antireflection film 6.

Then, as shown in FIG. 8E, the resist pattern 10a, the portion of the resist residue 18 underlying the resist pattern 10a, and the portion of the resist residue 18 on the inner surface of the via hole 8 are removed by using, e.g., an $O_2$ gas. Subsequently, etching is further performed with respect to the portion of the first protective film 4 exposed in the via hole 8 so that an opening is formed in the portion and the upper surface of the first metal wire 3 is exposed thereby. Thereafter, a metal is buried in the via hole 8 and in the trench 11 in the same manner as in, e.g., the first embodiment, whereby a second metal wire 12 in a dual damascene structure is formed.

Thus, the seventh embodiment has formed the via hole 8 in the organic-material-containing silicon oxide film 5 by etching and then, while the resist residue 18 produced in the etching step is left on the wall surface of the via hole 8 and the like, formed the resist film 10 having a trench pattern (the resist pattern 10*a* having an opening corresponding to the trench formation region including the region formed with the via hole 8) by lithography using the chemically amplified positive resist. This prevents direct contact between the resist and the organic-material-containing silicon oxide film 5 in the via hole 8 during the coating of the chemically amplified positive resist so that the diffusion of amine or a basic material from the organic-material-containing silicon oxide film 5 into the resist, i.e., a resist poisoning phenomenon is prevented. As a result, a post-develop defect in the resist can be prevented and hence the resist film 10 having a desired trench pattern, i.e., the resist pattern 10*a* without a trailing portion can be formed so that a wire in a dual damascene structure is formed reliably.

Since the seventh embodiment has formed the antireflection film 6 on the organic-material-containing silicon oxide film 5, lithography using the chemically amplified resist can be performed precisely. Since the seventh embodiment has also left the resist residue 18 on the antireflection film 6, the resist poisoning phenomenon is prevented reliably.

Since the seventh embodiment has removed the resist residue 18 covering the wall surface of the via hole 8 after the formation of the trench 11, an increase in the resistance of a via plug formed in the via hole 8 is prevented.

Although the seventh embodiment has formed the antireflection film 6 on the organic-material-containing silicon oxide film 5, the antireflection film 6 need not necessarily be formed. In this case, the resist residue 18 covers the entire exposed surface of the portion of the organic-material-containing silicon oxide film 5 located outside the via hole 8 and covers the entire inner surface of the via hole 8 including the side surfaces of the organic-material-containing silicon oxide film 5 exposed at the wall surface of the via hole 8. This prevents direct contact between the organic-material-containing silicon oxide film 5 and the resist film 10.

In the seventh embodiment, the material of the organic-material-containing silicon oxide film 5 is not particularly limited if it is lower in dielectric constant than a silicon oxide film. However, a wire-to-wire capacitance can be reduced positively if, e.g., SiOC is used. Instead of the organic-material-containing silicon oxide film 5, another low dielectric constant film, e.g., a porous film or the like may also be used.

In the seventh embodiment, the composition of the resist residue 18 is not particularly limited. If the resist residue 18 is composed of a compound of, e.g., $C_xF_y$ (where each of x and y is a natural number) and silicon, the resist poisoning phenomenon can be prevented reliably.

Although the seventh embodiment has used the chemically amplified positive resist to form the resist film 10 (resist pattern 10*a*) having a trench pattern, a chemically amplified negative resist may also be used instead. In this case also, a resist film having a trench pattern without size increase, i.e., a resist pattern having an opening with desired dimensions over the trench formation region can be formed so that a wire in a dual damascene structure is formed reliably.

Embodiment 8

A method for fabricating an electronic device according to an eighth embodiment of the present invention will be described with reference to the drawings.

FIGS. 9A to 9F are cross-sectional views illustrating the individual process steps of the method for fabricating an electronic device according to the eighth embodiment.

In the eighth embodiment, the individual process steps of the method for fabricating an electronic device according to the first embodiment shown in FIGS. 1A to 1C are performed initially. Specifically, an interlayer insulating film 2, a first metal wire 3, a first protective film 4, a low dielectric constant film (specifically an organic-material-containing silicon oxide film) 5, an antireflection film 6, and a resist film 7 having a via hole pattern are formed successively on a semiconductor substrate 1, as shown in FIG. 1A. Then, as shown in FIG. 1B, a via hole 8 is formed in the antireflection film 6 and the organic-material-containing silicon oxide film 5. After that, the resist film 7 is removed by ashing, as shown in FIG. 1C.

Figure 9A:
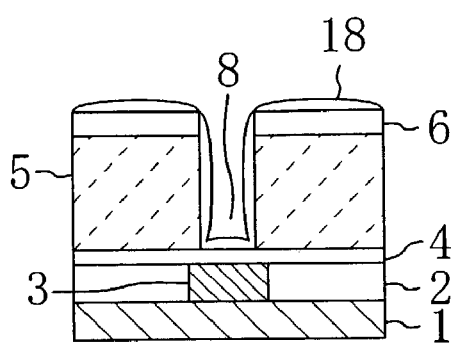
FIGS. 9A to 9F are cross-sectional views illustrating the individual process steps of a method for fabricating an electronic device according to an eighth embodiment of the present invention.

The present embodiment does not perform cleaning for removing resist residue such as a polymer generated in the step of forming the via hole 8 by etching, similarly to the seventh embodiment. Specifically, resist residue 18 is left on the entire inner surface of the via hole 8 and on the entire surface of antireflection film 6, as shown in FIG. 9A. Since etching for forming the via hole 8 is performed with respect to the entire surface of the substrate, the resist residue 18 is attached tightly to the entire inner surface of the via hole 8 with no gap. The resist residue 18 is a product derived from a fluorocarbon gas such as $C_4F_8$ used in the etching step for forming the via hole 8 and, specifically, a compound of $C_xF_y$ (each of x and y is a natural number) and silicon. The present embodiment also utilizes the resist residue 18 as a protective film for the organic-material-containing silicon oxide film 5, similarly to the seventh embodiment.

Figure 9D:
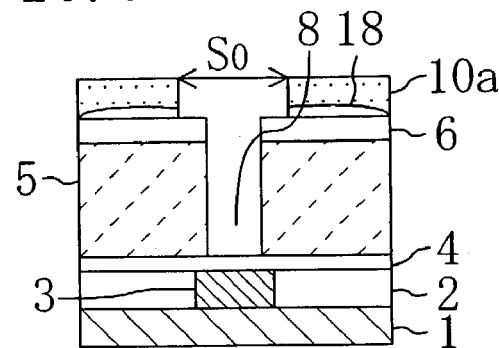
Figure 9B:
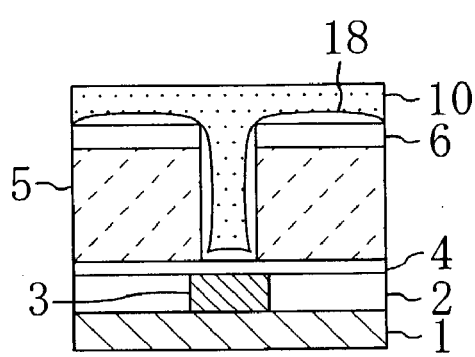

Next, as shown in FIG. 9B, a resist film 10 composed of a chemically amplified positive resist is coated over the entire surface of the resist residue 18 including the via hole 8. In the presence of the resist residue 18 left after the etching for forming the via hole 8, no direct contact occurs between the organic-material-containing silicon oxide film 5 and the resist film 10. Accordingly, the phenomenon of acid deactivation described in the first embodiment does not occur so that the resist film 10 is not degenerated.

Figure 9E:
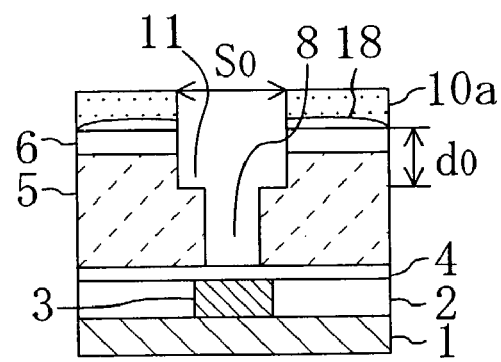
Figure 9C:
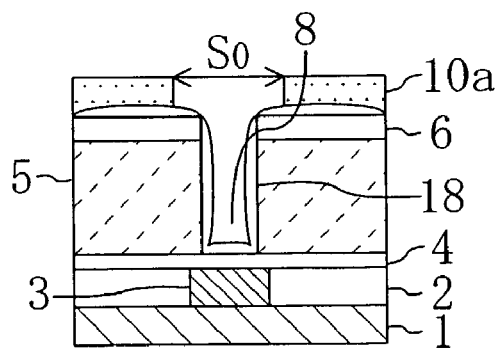

Then, as shown in FIG. 9C, an opening (trench pattern) with a width So is formed in the portion of the resist film 10 located in the trench formation region by exposure using a photo mask having a trench pattern and development subsequent thereto, i.e., lithography, whereby the resist film 10 having the trench pattern, i.e., a resist pattern 10*a* is formed. The trench formation region includes a region formed with the via hole 8.

Then, as shown in FIG. 9D, ashing is performed by a RIE (reactive ion etching) method using, e.g., an $O_2$ gas, thereby entirely removing the portion of the resist residue 18 located outside the resist pattern 10*a*, i.e., the portion of the resist residue 18 exposed in the opening of the resist film 10 (specifically the portion of the resist residue 18 overlying the antireflection film 6 uncovered with the resist pattern 10*a* and the portion of the resist residue 18 covering the entire inner surface of the via hole 8).

The present embodiment is different from the seventh embodiment in that it has preliminarily removed the portion of the resist residue 18 overlying the portion the antireflection film 6 located in the trench formation region prior to the trench forming step (see FIG. 9E). Accordingly, the present embodiment more greatly reduces a load on etching for forming the trench than in the trench forming step according to the seventh embodiment (see FIG. 8D) because the resist residue 18 does not exist on the trench formation region. This reduces the time required for the etching and thereby reduces an amount of resist etching.

Subsequently, as shown in FIG. 9E, dry etching using the resist pattern 10a as a mask is performed successively with respect to the antireflection film 6 and the organic-material-containing silicon oxide film 5, thereby forming a trench (wiring groove) 11 at a depth (depth from the surface of the antireflection film 6) $d_0$ connecting to the via hole 8 in the organic-material-containing silicon oxide film 5 and in the antireflection film 6. Since the present embodiment has thus removed the resist residue 18 in the trench formation region therefrom prior to the step shown in FIG. 9E, it can more greatly reduce a load on etching for trench formation than the seventh embodiment so that the time required for the etching is reduced and an amount of resist etching is thereby reduced.

Figure 9F:
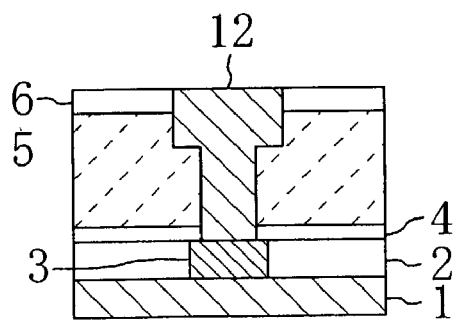
Figure 10A:
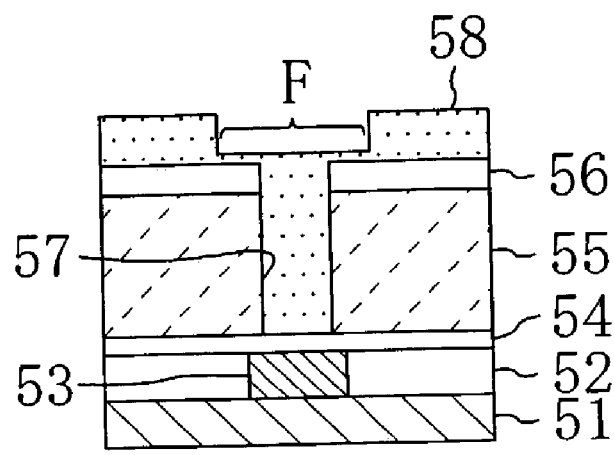
FIGS. 10A and 10B show a problem encountered when a chemically amplified positive resist is used in a conventional wire forming method.
Figure 10B:
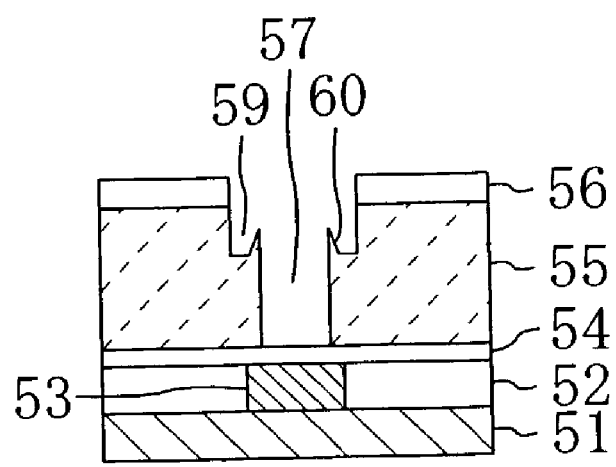
Figure 11A:
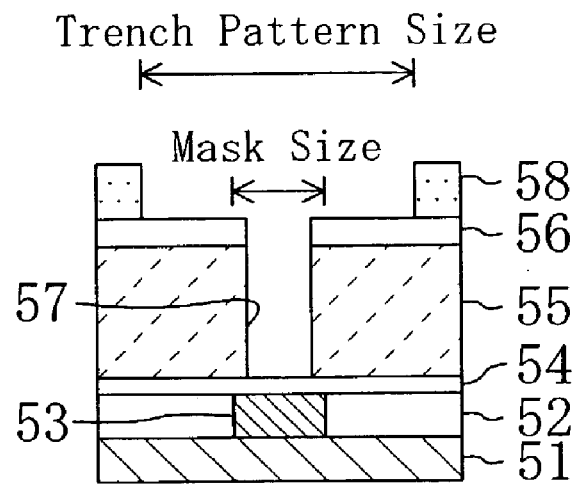
FIGS. 11A and 11B show a problem encountered when a chemically amplified negative resist is used in a conventional wire forming method.
Figure 11B:
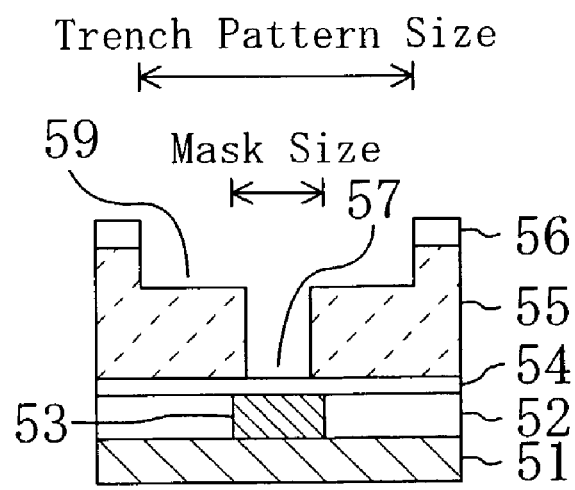
Figure 12A:
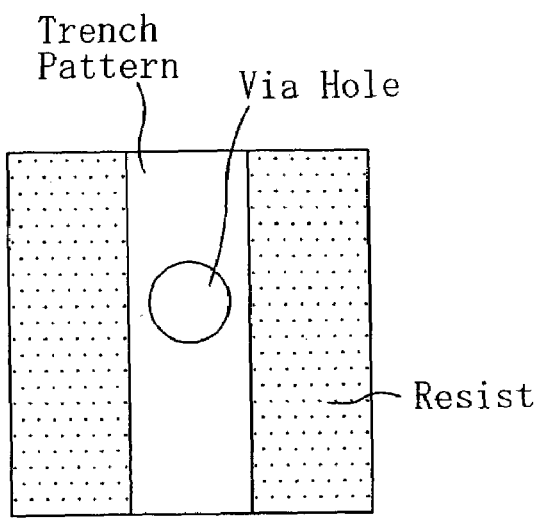
FIG. 12A is a plan view showing a resist film having a trench pattern with a desired mask size which has been formed.
Figure 12B:
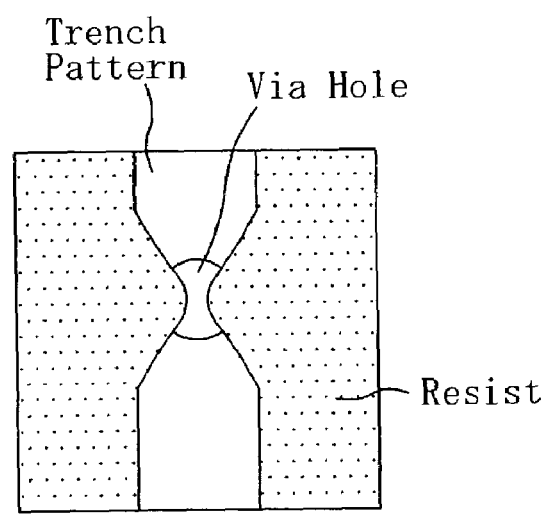
FIG. 12B is a plan view showing a resist film having a trailing trench pattern which has been formed on an insulating film formed with a via hole by lithography using a chemically amplified positive resist.
Figure 12C:
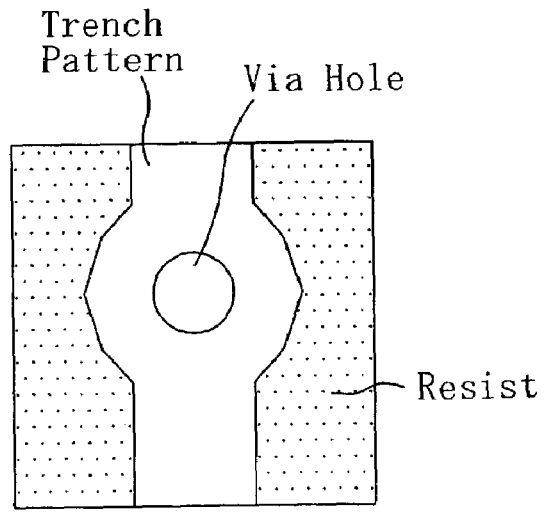
FIG. 12C is a plan view showing a resist film having a trench pattern larger than desired mask dimensions which has been formed on an insulating film formed with a via hole by lithography using a chemically amplified negative resist.

Then, as shown in FIG. 9F, the resist pattern 10a is removed by ashing. Subsequently, etching is further performed with respect to the portion of the first protective film 4 exposed in the via hole 8 so that an opening is formed in the portion and the upper surface of the first metal wire 3 is exposed thereby. Thereafter, a metal is buried in the via hole 8 and in the trench 11 in the same manner as in, e.g., the first embodiment, whereby a second metal wire 12 in a dual damascene structure is formed.

Thus, the eighth embodiment has formed the via hole 8 in the organic-material-containing silicon oxide film 5 by etching and then, while the resist residue 18 produced in the etching step is left on the wall surface of the via hole 8 and the like, formed the resist film 10 having a trench pattern (the resist pattern 10a having an opening corresponding to the trench formation region including the region formed with the via hole 8) by lithography using the chemically amplified positive resist. This prevents direct contact between the resist and the organic-material-containing silicon oxide film 5 in the via hole 8 during the coating of the chemically amplified positive resist so that the diffusion of amine or a basic material from the organic-material-containing silicon oxide film 5 into the resist, i.e., a resist poisoning phenomenon is prevented. As a result, a post-develop defect in the resist can be prevented and hence the resist film 10 having a desired trench pattern, i.e., the resist pattern 10a without a trailing portion can be formed so that a wire in a dual damascene structure is formed reliably.

Since the eighth embodiment has formed the antireflection film 6 on the organic-material-containing silicon oxide film 5, lithography using the chemically amplified resist can be performed precisely. Since the eighth embodiment has also left the resist residue 18 on the antireflection film 6, the resist poisoning phenomenon is prevented reliably.

According to the eighth embodiment, the portion of the resist residue 18 exposed in the opening of the resist film 10, i.e., the portion of the resist residue 18 located in the trench formation region is removed preliminarily prior to the trench formation step (see FIG. 9E). Consequently, the portion of the resist residue 18 covering the wall surface of the via hole 8 is also removed so that an increase in the resistance of a via plug formed in the via hole 8 is prevented. Since the load on etching for trench formation can be reduced, the time required for etching is reduced and an amount of resist etching is thereby reduced.

Although the eighth embodiment has formed the antireflection film 6 on the organic-material-containing silicon oxide film 5, the antireflection film 6 need not necessarily be formed. In this case, the resist residue 18 covers the entire exposed surface of the portion of the organic-material-containing silicon oxide film 5 located outside the via hole 8 and covers the entire inner surface of the via hole 8 including the side surfaces of the organic-material-containing silicon oxide film S exposed at the wall surface of the via hole 8. This prevents direct contact between the organic-material-containing silicon oxide film 5 and the resist film 10.

In the eighth embodiment, the material of the organic-material-containing silicon oxide film 5 is not particularly limited if it is lower in dielectric constant than a silicon oxide film. However, a wire-to-wire capacitance can be reduced positively if, e.g., SiOC is used. Instead of the organic-material-containing silicon oxide film 5, another low dielectric constant film, e.g., a porous film or the like may also be used.

In the eighth embodiment, the composition of the resist residue 18 is not particularly limited. If the resist residue 18 is composed of a compound of, e.g., $C_xF_y$ (where each of x and y is a natural number) and silicon, the resist poisoning phenomenon can be prevented reliably.

Although the eighth embodiment has used the chemically amplified positive resist to form the resist film 10 (resist pattern 10a) having a trench pattern, a chemically amplified negative resist may also be used instead. In this case also, a resist film having a trench pattern without size increase, i.e., a resist pattern having an opening with desired dimensions over the trench formation region can be formed so that a wire in a dual damascene structure is formed reliably.

What is claimed is:

1. A method for fabricating an electronic device, the method comprising the steps of:
   forming a low dielectric constant film on a substrate;
   forming a hole in the low dielectric constant film;
   forming a fluorocarbon film on at least a surface of the hole;
   forming a chemically amplified resist on the low dielectric constant film including the hole after forming the fluorocarbon film which prevents amine or a basic material from diffusing from the low dielectric constant film into the chemically amplified resist;
   forming a resist pattern having an opening corresponding to a wire region including a region formed with the hole; and
   etching the low dielectric constant film by using the resist pattern as a mask to form a wire groove connected to the hole.

2. The method of claim 1, wherein the fluorocarbon film is formed on a portion of the low dielectric constant film located outside the hole.

3. The method of claim 1, wherein an antireflection film is formed on a portion of the low dielectric constant film located outside the hole.

4. The method of claim 3, wherein the fluorocarbon film is formed on the antireflection film.

5. The method of claim 1, further comprising, after the step for forming the wire groove, the step of:
   removing the fluorocarbon film.

6. The method of claim 1, wherein the low dielectric constant film is a carbon-containing silicon oxide film or a porous film.

7. The method of claim 6, wherein the carbon-containing silicon oxide film is a SiOC film.

8. The method of claim 1, wherein the fluorocarbon film is formed by using a plasma comprising a fluorocarbon gas.

9. A method for fabricating an electronic device, the method comprising the steps of:

forming a low dielectric constant film on a substrate;

forming a hole in the low dielectric constant film;

providing a plasma including $H^+$ ion or $OH^+$ ion on at least surface of the hole so as to neutralize or reduce an amine or a basic material in the low dielectric constant film;

after the step of providing the plasma, forming a chemically amplified resist on the low dielectric constant film including the hole and exposing and developing the chemically amplified resist to form a resist film having an opening corresponding to a wire formation region including a region formed with the hole; and etching the low dielectric constant film by using the resist film as a mask to form a wiring groove connected to the hole.

10. The method of claim 9, wherein the plasma is generated from a $H_2$ gas or a $H_2O$ gas.

11. The method of claim 9, wherein the low dielectric constant film is a carbon-containing silicon oxide film or a porous film.

12. The method of claim 11, wherein the carbon-containing silicon oxide film is a SiOC film.

* * * * *